United States Patent
Thomas et al.

(10) Patent No.: US 8,723,267 B2
(45) Date of Patent: May 13, 2014

(54) INTEGRATED CIRCUIT MADE OUT OF SOI WITH TRANSISTORS HAVING DISTINCT THRESHOLD VOLTAGES

(75) Inventors: Olivier Thomas, Revel (FR); Jean-Philippe Noel, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 36 days.

(21) Appl. No.: 13/262,376

(22) PCT Filed: Apr. 1, 2010

(86) PCT No.: PCT/EP2010/054415
§ 371 (c)(1),
(2), (4) Date: Feb. 9, 2012

(87) PCT Pub. No.: WO2010/112585
PCT Pub. Date: Oct. 7, 2010

(65) Prior Publication Data
US 2012/0126333 A1    May 24, 2012

(30) Foreign Application Priority Data
Apr. 1, 2009    (FR) ..................... 09 01595

(51) Int. Cl.
*H01L 21/70*    (2006.01)
*H01L 21/8238*    (2006.01)
*H01L 27/092*    (2006.01)
*H01L 27/11*    (2006.01)

(52) U.S. Cl.
CPC . *H01L 21/823807* (2013.01); *H01L 21/823842* (2013.01); *H01L 27/092* (2013.01); *H01L 27/11* (2013.01); *H01L 21/823814* (2013.01)
USPC ........................................ 257/369

(58) Field of Classification Search
CPC ............. H01L 21/823807; H01L 21/823842; H01L 21/823814; H01L 27/092; H01L 27/11
USPC ........................................... 257/369
See application file for complete search history.

(56) References Cited

U.S. PATENT DOCUMENTS

| | | | |
|---|---|---|---|
| 6,063,686 A * | 5/2000 | Masuda et al. | 438/406 |
| 6,442,060 B1 | 8/2002 | Leung et al. | |
| 2011/0241123 A1* | 10/2011 | Li | 257/369 |

OTHER PUBLICATIONS

Hon-Sum Philip Wong et al., Nanoscale CMOS Proceedings of the IEEE, vol. 87 No. 4 537-551 (1999).*
Kawahara "Low-voltage embedded RAMS in nanometer era", IEICE Transactions on Electronics Inst. Electron. Inf. & Commun. Eng Japan, vol. e90 No. 4, 2007.

(Continued)

*Primary Examiner* — Anthony Ho
(74) *Attorney, Agent, or Firm* — Occhiuti & Rohlicek LLP

(57) ABSTRACT

The invention relates to an integrated circuit including an active semiconducting layer separated from a semiconducting substrate layer by an embedded insulating material surface, including: first and second transistors (205, 213) of a single type; first and second floorplans arranged vertically perpendicular to the first and second transistors; wherein the first transistor has a doping of the floorplan thereof, opposite that of the source thereof, and a first threshold voltage; the second transistor has a doping of the floorplan thereof, identical to that of the source thereof, and a second threshold voltage; the first threshold voltage is dependent on the potential difference applied between the source and the floorplan of the first transistor; and the second threshold voltage is dependent on the potential difference applied between the source and the floorplan of the second transistor.

24 Claims, 11 Drawing Sheets

(56) References Cited

OTHER PUBLICATIONS

Yamaoka et al. "SRAM Circuit With Expanded Operating Margin and Reduced Stand-By Leakage Current Using Thin-Box FD-SOI Transistors" IEEE Journal of Solid-State Circuits, 41:11 2366-2372, 2006.

Gallon et al. "Ultra-thin Fully Depleted SOI Devices With Thin Box, Ground Plane and Strained Liner Booster", IEEE International SOI Conference 17-18, 2006.

Saibal Mukhopadhyay et al. "Device Design and Optimization Methodology for Leakage and Variability Reduction in Sub-45-nm FD/SOI SRAM" IEEE Transactions on Electron Devices, 54:1, 2008.

Kim et al. "Stable High-Density FD/SOI SRAM With Selective Back-Gate Bias Using Dual Buried Oxide" IEEE International SOI Conference Proceedings 37-38, 2008.

Giraud et al. "In-Depth Analysis of 4T SRAM Cells in Double-Gate CMOS" International Conference on Integrated Circuit Design and Technology, 265-268, 2007.

Noel et al. "Multi-$V_T$ Device Optimizations Based on Circuit Environment Constraints in UT2B-FDSOI Technology".

Fenouillet-Beranger et al. "Efficient Multi-$V_T$ FDSOI Technology with UTBOX for Low Power Circuit Design" *Symposium on VLSI Technology (VLSIT)*, pp. 65-66 (2010).

Thomas et al. "32nm and Beyond Multi-$V_T$ Ultra-Thin Body and BOX FDSOI: From Device to Circuit" *IEEE International Symposium on Circuits and Systems (ISCAS)*, pp. 1703-1706 (2010).

Noel et al. "A Simple and Efficient Concept for Setting Up Multi-$V_T$ Devices in Thin BOx Fully Depleted SOI Technology" *Proceedings of the European Solid State Device Research Conference (ESSDERC)*, pp. 137-140 (2009).

\* cited by examiner

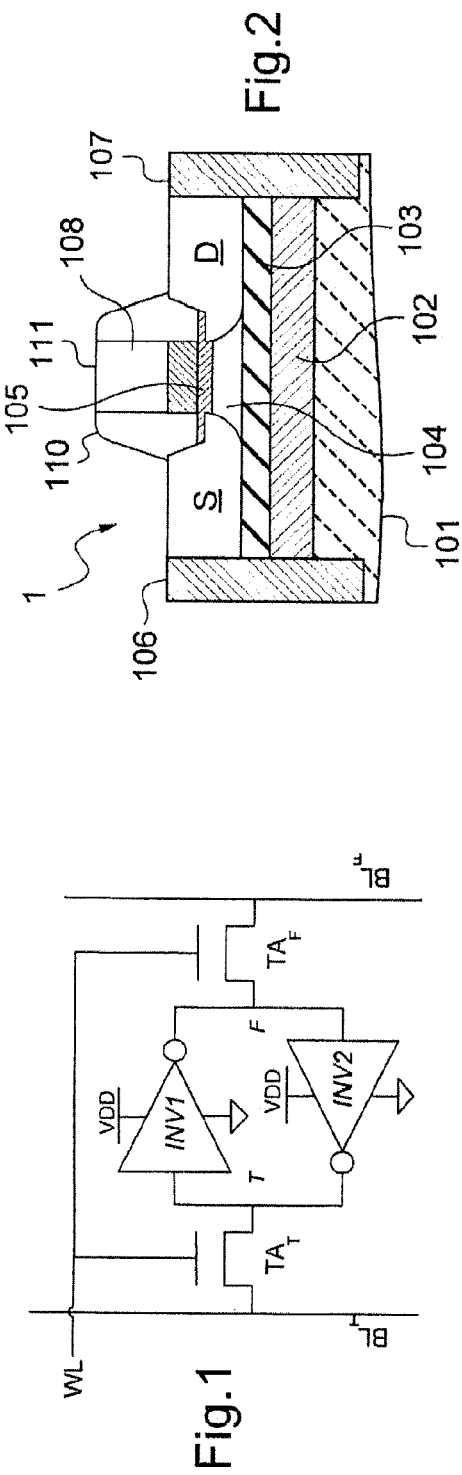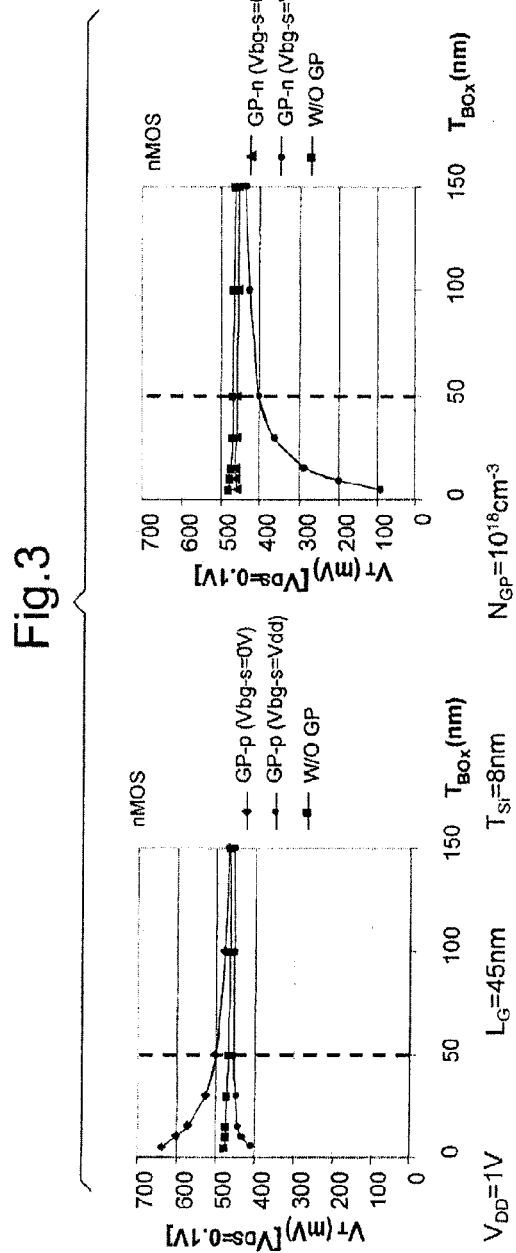

Fig.4
| $V_{BG-S}$ | 0 V | $V_{DD}$ |
|---|---|---|
| GP-n | $V_T$ | $V_{TL}$ |
| GP-p | $V_{TH}$ | $V_T$ |
nMOS
| $V_{BG-S}$ | 0 V | $|V_{DD}|$ |
|---|---|---|
| GP-n | $V_{TH}$ | $V_T$ |
| GP-p | $V_T$ | $V_{TL}$ |
pMOS
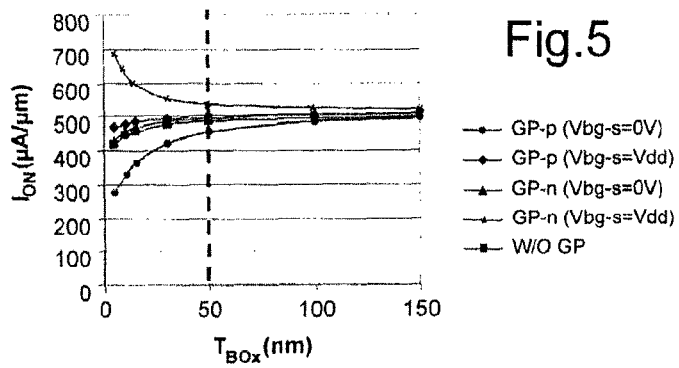
Fig.5
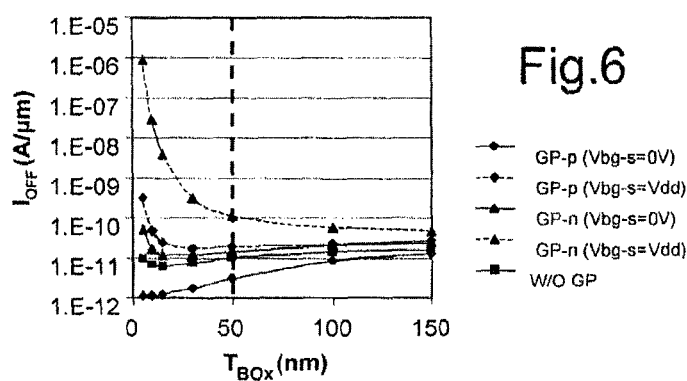
Fig.6
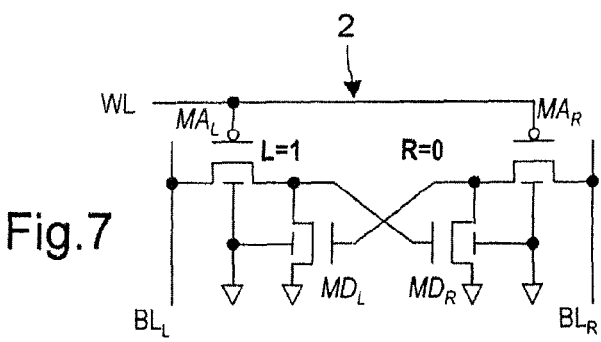
Fig.7

| | 4T |
|---|---|
| S (μm²) | 0.224 |
| $I_{CELL}$ (μA) | 17.1 |
| $I_{LEAK}$ (pA) | 12.9 |
| NBL | $10^6$ |
| SNM (mV) | 205 |
| RNM (mV) | 209 |
| WM (mV) | 224 |
Fig.12
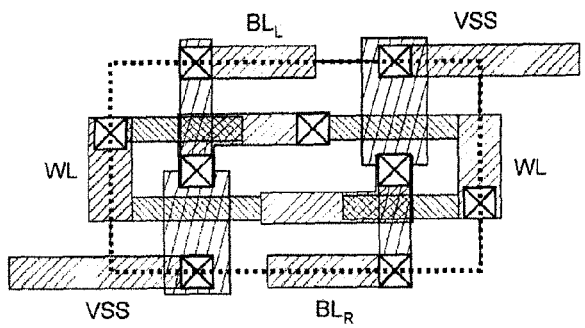
Fig.13
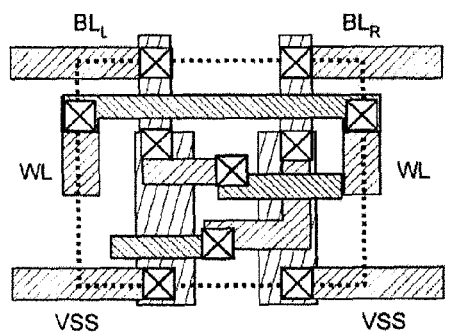
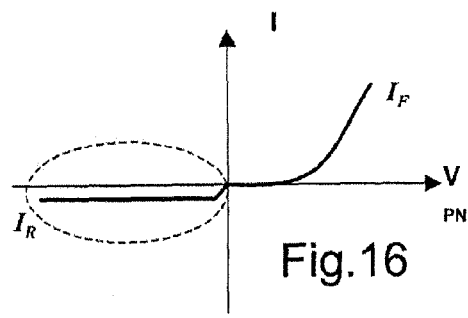
Fig.14
Fig.16
Fig.17
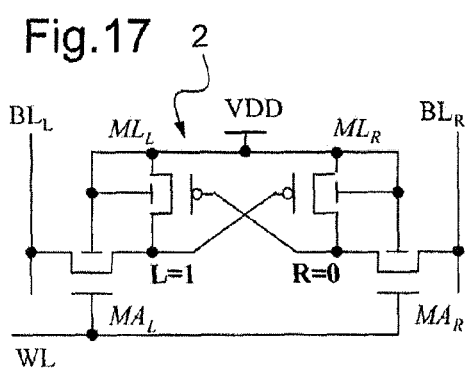
Fig.18
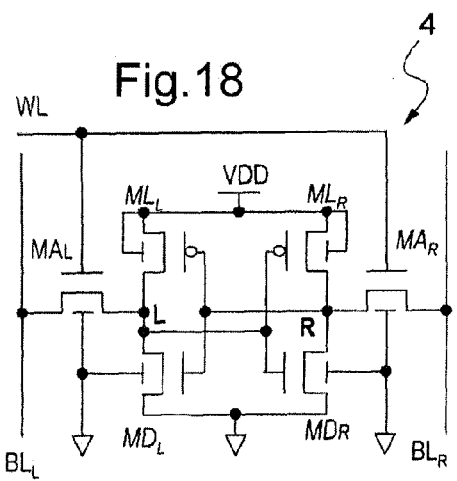

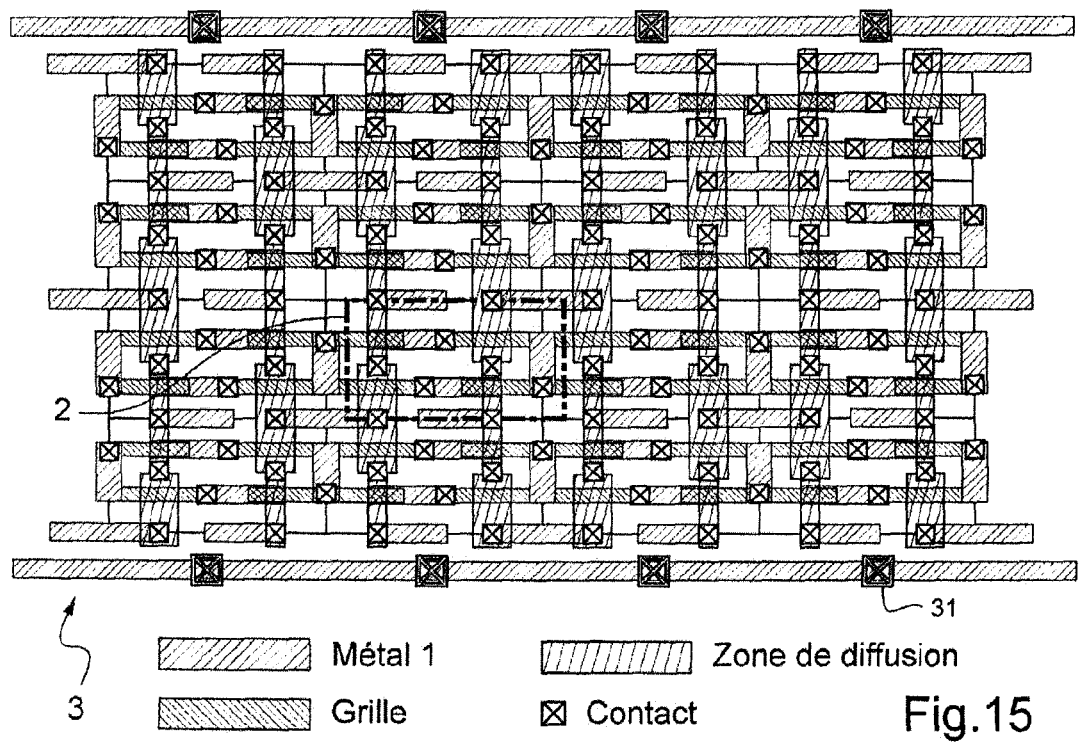
| | Métal 1 | | Zone de diffusion |
|---|---|---|---|
| | Grille | ⊠ | Contact |
Fig.15
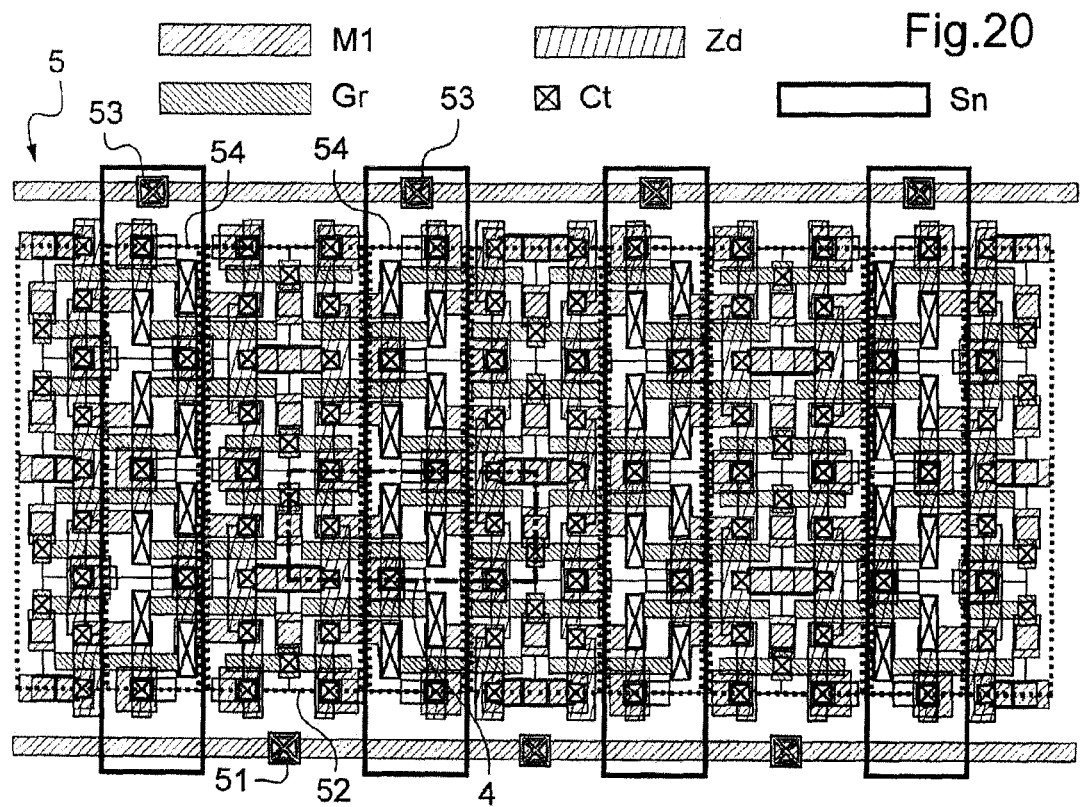
| | M1 | | Zd | | Fig.20 |
|---|---|---|---|---|---|
| | Gr | ⊠ Ct | | | Sn |

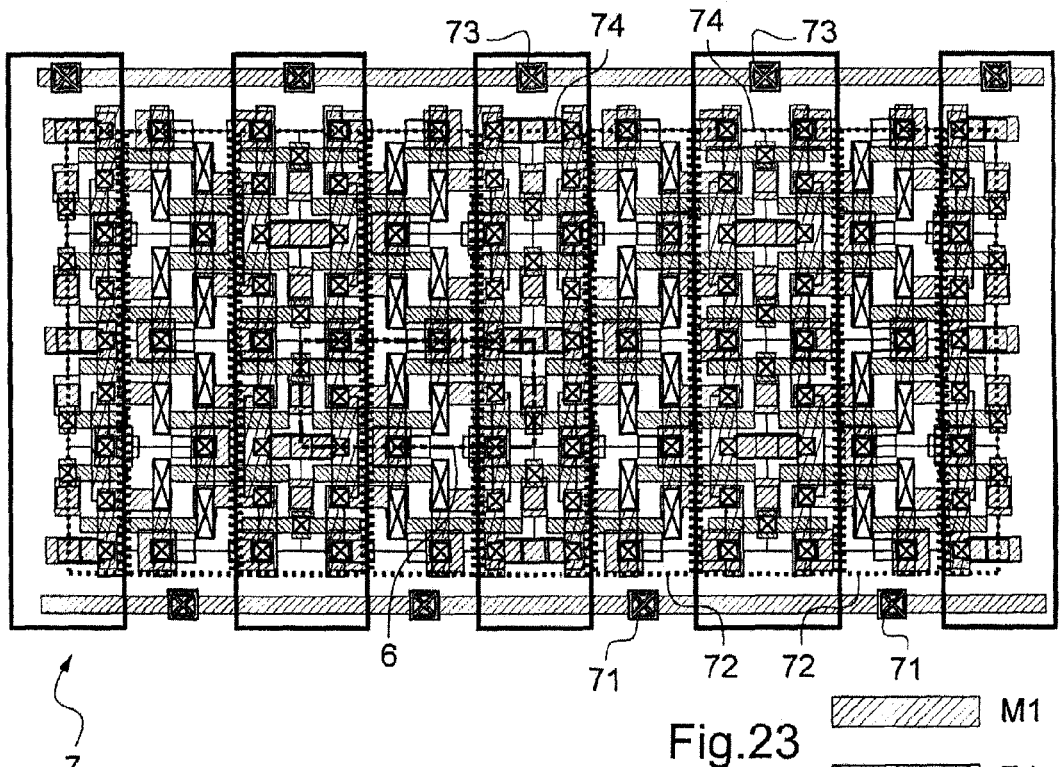
Fig.23
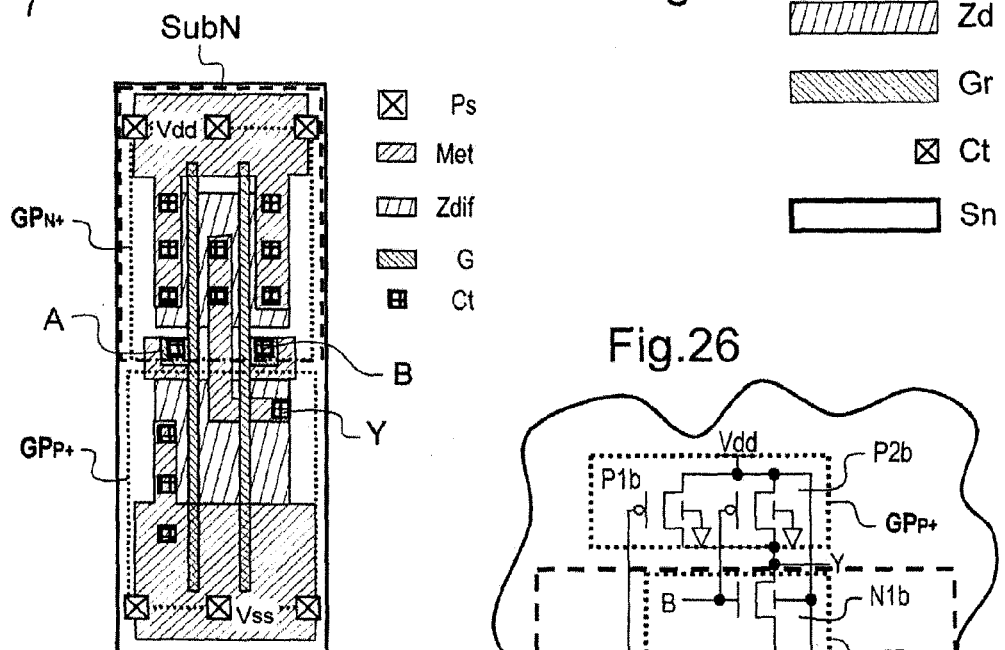
Fig.25
Fig.26
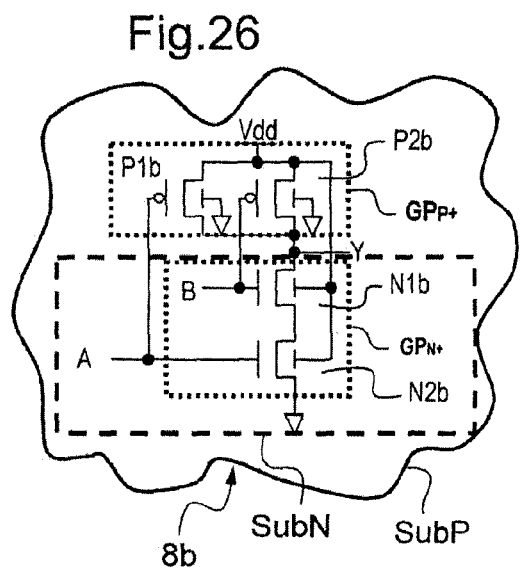

INTEGRATED CIRCUIT MADE OUT OF SOI WITH TRANSISTORS HAVING DISTINCT THRESHOLD VOLTAGES

CROSS REFERENCE TO RELATED APPLICATIONS

This application is the national stage entry under 35 USC 371 for PCT/EP2010/054415, filed Apr. 1, 2010, which claims the benefit of the Apr. 1, 2009 priority date of French application 0901595. The contents of both the foregoing applications are incorporated herein by reference.

The invention pertains to integrated circuits and especially to integrated circuits made on a silicon-on-insulator (SOI) type substrate. In SOI technology, a fine layer of silicon (of a few tens of nm) is separated from a fine silicon substrate by a relatively thick layer of insulator (generally of a few hundred nanometers).

Integrated circuits made with SOI technology have a certain number of advantages. Such circuits generally have lower electrical consumption for equivalent performance. Such circuits also induce lower stray capacitances, thus improving switch-over speed. Furthermore, the latch-up phenomenon encountered by CMOS transistors in bulk technology can be avoided. Such circuits therefore prove to be particularly suited to SOC or MEMS type applications. It can also be noted that SOI circuits are more sensitive to the effect of ionizing radiation and thus prove to be more reliable in applications where such radiation can induce operating problems, especially for spatial applications. SOI integrated circuits may in particular comprise SRAM-type random-access memories or logic gates.

As illustrated in FIG. 1, a SRAM memory cell consists of two inverters Inv1 and Inv2 connected in a bistable flip-flop configuration and two access transistors TAT and TAF connected to bit lines BLT and BLF. The access transistors TAT and TAF are controlled by a word line WL. The requirements which the memory cell must meet are:

- sufficient stability ensuring that the cell works during read, write or retention operations;
- a maximum conduction current to increase speed of access to the cell;
- a minimum cell size to increase integration density; and
- a minimum retention current to reduce electrical consumption in static mode.

Two types of memory cells are being developed concurrently. A first type of memory known as 4T uses two driver transistors to form the inverters of the bistable flip-flop circuit. FIG. 4 of the U.S. Pat. No. 6,442,060 illustrates an example of a SRAM memory cell made according to this architecture. However, although this memory cell architecture theoretically makes it possible to obtain very high density, the presence of internal floating nodes entails a trade-off in sizing between the requirements of stability in reading and stability in retention. In order to increase stability in reading and in retention, several studies propose dynamic circuits individually controlling the transistors of the memory cells. The density of cells of a memory made by 4T architecture then proves in practice to be relatively limited, thus giving this architecture limited value for use on an industrial scale.

A second type of memory known as the 6T memory uses four transistors to form the inverters. FIG. 2 of the U.S. Pat. No. 6,442,060 illustrates an example of a SRAM memory cell made according to this architecture. Certain memory circuits have to integrate both memory cells promoting swift access to the storage nodes and memory cells promoting limited electrical consumption in retention.

Such memory circuits prove to be difficult to make, since the topology and the design of the two types of memory are radically different in order that each of them will have either a high level of fast access or limited consumption in retention.

For etching technologies at 45 nm or less, it becomes tricky to increase the cell density while maintaining efficient margins in terms of noise both in reading and in writing. The importance of variations in manufacturing in the electrical parameters of the transistor becomes ever more critical as the etching becomes ever finer. This increases the sensitivity of the integrated circuit to different sources of noise: capacitive coupling, inductive coupling, power supply noise etc.

Much research has also been conducted on reducing the static consumption of logic gates, while increasing their switching speed. Certain integrated circuits that are being developed integrate both low-consumption logic gates and high-switching-speed logic gates. To generate these two types of logic gates on one and the same integrated circuit, the threshold voltage of certain transistors of the fast-access logic gates is lowered and the threshold voltage of the other low-consumption logic gate transistors is increased. In bulk technology, the modulation of the threshold voltage level of transistors of a same type is done by differentiating the level of doping of their channel. However, in FDSOI (Fully Depleted Silicon-On-Insulator) technology, the channel doping is almost zero. Thus, the doping level of the channel of the transistors cannot show major variations, thus preventing the differentiation of the threshold voltages by this means. One approach, proposed in certain studies, to make transistors of a same type at distinct threshold voltages is to integrate certain gate materials for these transistors. However, making such an integrated circuit proves, in practice, to be technically difficult and economically prohibitive.

There is therefore a need for integrated circuits having transistors with different threshold levels that can be made with lower complexity.

The invention seeks to resolve one or more of these drawbacks. The invention therefore pertains to an integrated circuit comprising an active semiconductive layer separated from a semiconductive substrate layer by a buried layer of insulator material comprising PMOS and NMOS transistors, the circuit comprising:

- first and second transistors of a same, PMOS or NMOS, type;
- first and second ground planes respectively positioned over the first and second transistors, between the buried layer of insulator material and the silicon substrate layer.

Furthermore:

- the first transistor has a type of doping of its ground plane opposite that of its source, and has a first threshold voltage;
- the second transistor has a type of doping of its ground plane identical to that of its source and has a second threshold voltage;
- the first threshold voltage is a function of the potential difference applied between the source and the ground plane of the first transistor;
- the second threshold voltage is a function of the difference in potential applied between the source and the ground plane of the second transistor;
- the first and second threshold voltages are capable of varying respectively in first and second ranges of voltages should the difference in potential between the ground plane and the source of the first or second transistor vary between a zero value and a value equal to the power supply voltage of the circuit;

the thickness of the layer of insulator material is fine enough for the maximum value of the first range to be greater by at least 10% than the minimum value of the first range, and the minimum value of the second range is lower by at least 10% than the maximum value of the second range.

According to one variant, the maximum value of the first range is greater than the maximum value of the second range.

According to another variant, the maximum value of the first range is greater by at least 40 mV than the minimum value of the first range, and the minimum value of the second range is smaller by at least 40 mV than the maximum value of the second range.

According to yet another variant, the thickness of the buried layer of insulator material at the first and second transistors is fine enough for the first threshold voltage to be greater than the second threshold voltage when a same difference in reference potential is applied between the source and the ground plane of the first and second transistors.

According to yet another variant, the first and second transistors have respective gates made out of the same type of metal.

According to one variant, the first and second transistors have an identical structure except for the doping of their ground plane.

According to yet another variant, the first and second transistors have respective gates made out of respective metals having distinct work function values.

According to another variant, the circuit comprises a memory including:
  at least one word line;
  at least two bit lines;
  a 4T-type memory cell including third and fourth transistors and also including fifth and sixth transistors, the fifth transistor having a structure similar to that of the third transistor to show a same threshold voltage, the sixth transistor having a structure similar to that of the fourth transistor to show a same threshold voltage, the third and fourth transistors being of opposite types, the third and fifth transistors being connected to form a bistable flip-flop circuit having two storage nodes, the fourth and sixth transistors being controlled by the word line to selectively connect the nodes of the bistable flip-flop circuit to respective bit lines.

According to yet another variant, the difference in potential between the source of the third and fifth transistors and their respective ground plane is substantially zero and the difference in potential between the source of the fourth and sixth transistors and their respective ground plane is substantially equal to a voltage Vdd.

According to one variant, the circuit comprises a memory including:
  at least one word line;
  at least two bit lines;
  a 4T-type memory cell including third and fourth transistors and also including fifth and sixth transistors, the third to sixth transistors being positioned over respective ground planes between the buried layer of insulator material and the silicon substrate layer, the fifth transistor being of the same type as the third transistor, the sixth transistor being of the same type as the fourth transistor, the third and fourth transistors being of opposite types, the third and fifth transistors being connected to form a bistable flip-flop circuit with two storage nodes, the ground planes of the third and fourth transistors being connected to the gate of the third transistor and the ground planes of the fifth and sixth transistors being connected to the gate of the fifth transistor, the fourth and sixth transistors being controlled by the word line to respectively connect the nodes of the bistable flip-flop circuit to respective bit lines.

According to yet another variant, the circuit comprises a memory including first and second 6T-type memory cells, each having one word line, two bit lines, two load transistors and two driver transistors connected to form a bistable flip-flop circuit having two storage nodes, each memory cell furthermore having two access transistors controlled by the word line to selectively connect the nodes of the bistable flip-flop circuit to the respective bit lines, the first transistor forming an access transistor of the first memory cell and the second transistor forming an access transistor of the second memory cell.

According to yet another variant, the driver transistors of the first memory cells have a type of doping of their ground plane that is identical to that of the ground plane of their access transistor, a thickness of the layer of insulator material identical to that of their access transistor and a bias of their ground plane identical to that of the ground plane of their access transistor.

According to one variant, a ground plane is common for a driver transistor and for an access transistor of one of the memory cells.

According to yet another variant, the circuit comprises first and second logic gates, each logic gate comprising at least two transistors controlled by respective input terminals, said first transistor forming one of said transistors of the first logic gate and said second transistor forming one of said transistors of the second logic gate.

According to one variant, the first and second transistors are nMOS-type transistors.

According to yet another variant, the difference in potential between the ground plane of the first transistor and its source is zero and the difference in potential between the ground plane of the second transistor and its source is equal to a voltage Vdd.

According to another variant, the buried layer of insulator material has a thickness of less than 50 nm and the width of the gate of said transistors is smaller than 50 nm.

According to yet another variant, the buried layer of insulator material has a thickness smaller than the gate length of one of said transistors.

According to one variant, the circuit has a seventh transistor made in the semiconductive active layer, this seventh transistor being devoid of any ground plane between the buried layer of insulator material and the silicon substrate layer placed over it.

According to yet another variant, the circuit has an nMOS-type eighth transistor and a pMOS-type ninth transistor,
  eighth and ninth ground planes respectively placed over the eighth and ninth transistors between the buried layer of insulator material and the silicon substrate layer, the eighth ground plane having P type doping and the ninth ground plane having N type doping;
  a well with N type doping separating the eighth ground plane from the silicon substrate layer;
  a well with P type doping separating the ninth ground plane from the silicon substrate layer;
  an insulating trench extending from the active silicon layer to said wells so as to separate the eighth and ninth ground planes.

According to yet another variant, the well with N type doping is excited by a voltage Vdd and the well with P type doping is connected to a ground.

According to one variant, the circuit has a logic module including the second transistor, the first transistor connecting the logic module to a power supply voltage, a zero difference in potential being applied between the source and the ground plane of the first transistor, a difference in potential with a value zero being applied between the source and the ground plane of the second transistor.

According to yet another variant, the first and second transistors are adjacent, the ground planes of the first and second transistors being separated from the semiconductive substrate layer by a first well forming a strip and having a first type of doping, the first well being powered by a first level of voltage, the integrated circuit furthermore comprising tenth and eleventh transistors of a type opposite the first and second transistors, the tenth and eleventh transistors being adjacent and having ground planes for which the types of doping are opposite, the ground planes of the tenth and eleventh transistors being separated from the semiconductive substrate layer by a second well adjacent to the first well and forming a strip, the second well having a doping of a second type opposite to that of the first type, the second well being powered by a second voltage level, the first and tenth transistors having respective gates whose work function values are distinct, the second and eleventh transistors having respective gates whose work function values are distinct.

According to yet another variant, the first and tenth transistors are adjacent and belong to a same logic gate, and the second and eleventh transistors are adjacent and belong to a same logic gate, and the type of doping of the ground plane of the first transistor is opposite the type of doping of the ground plane of the tenth transistor, and the first and second transistors have respective gates for which the work function values are distinct.

Other features and advantages of the invention shall appear more clearly from the following description made here below by way of an indication that is in no way exhaustive, made with reference to the appended drawings, of which:

FIG. 1 is a schematic representation of a memory cell;

FIG. 2 is sectional view of a transistor made on an SOI substrate provided with a buried insulator layer;

FIG. 3 illustrates the threshold voltage of an nMOS transistor as a function of different parameters;

FIG. 4 is a table providing levels of threshold voltage of an nMOS transistor and a pMOS transistor as a function of different parameters;

FIG. 5 illustrates the conduction current of an nMOS transistor as a function of different parameters;

FIG. 6 illustrates the leakage current of an nMOS transistor as a function of different parameters;

FIG. 7 is an electrical diagram of an example of a 4T-type memory cell according to the invention;

FIG. 12 is a table illustrating the electrical performance of two types of memory cells;

FIGS. 13 and 14 are topologies for the two types of memory cells compared in the table of FIG. 12;

FIG. 15 shows a topology of a matrix of memory cells;

FIG. 16 is a graph showing a range of bias voltage of a substrate layer;

FIG. 17 is an electric diagram of a variant of a 4T-type memory cell;

FIG. 18 is an electric diagram of a first example of a 6T-type memory cell integrated into a circuit according to the invention;

FIG. 20 is a topology of a matrix of memory cells according to FIG. 18;

FIG. 23 is a topology of a matrix of memory cells according to FIG. 21;

FIG. 25 is a topology of the logic gate of FIG. 24;

FIG. 26 is an electric diagram of another example of a logic gate integrated into the substrate of a circuit according to the invention;

Figure 8:
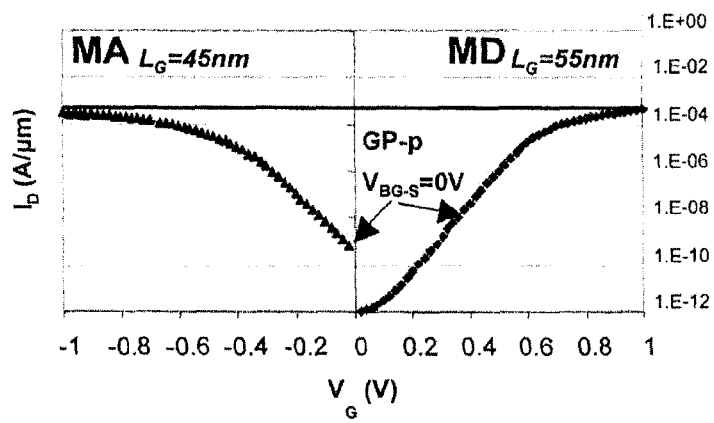
FIG. 8 is a graph representing respectively the drainage currents as a function of the gate voltage (from IOFF to ION) of a driver transistor and an access transistor.

It is proposed to make the invention on an integrated circuit provided with transistors, a first transistor possibly having a first threshold voltage while a second transistor can have a second threshold voltage. In order to modulate the threshold voltages of these transistors within different ranges, the first transistor has a doping of its ground plane opposite that of its source while the second transistor has a doping of its ground plane identical to that of its source. The invention uses a thickness of insulating layer beneath the transistors that is small enough for the first threshold voltage to be greater than the second threshold voltage for the application of a same difference in reference potential.

The threshold voltages and the potential differences between a source and a ground plane will be identified in terms of absolute value here below.

FIG. 2 represents an example of a structure of a transistor 1 made with SOI technology and provided with a ground plane. The transistor 1 has a silicon substrate layer 101. The transistor 1 has a buried layer of insulator material 103 separated from the substrate layer 101 by means of a ground plane 102. The insulator layer 103 is surmounted by an active silicon layer in which a source S, a channel 104 and a drain D are made. The ground plane 102 enables improvement in the electrostatic control of the transistor by limiting the penetration of the electrical fields generated by the drain and the source beneath the channel 104. The reduction of the lateral electrostatic coupling reduces the short channel effects and restricts the effect of depletion by the drain or "drain-induced barrier lowering" (DIBL). The channel 104 is lined with a layer of gate oxide 105. The gate oxide 105 is surmounted by a gate stack comprising a metal gate 108 and a polysilicon layer 111. The stack is demarcated laterally by spacers 110. Insulation trenches 106 and 107 are placed around the transistor 1 between the surface of the active silicon layer and extend up to the underneath of the lower part of the ground plane 102 in the substrate layer 101.

FIGS. 3 and 4 illustrate results of tests performed with the parameters of transistors having the following characteristics:

$V_{DD}$=1V

L (effective gate length)=33 nm of physical gate length $T_{Si}$ (channel thickness)=8 nm $N_{GP}$ (ground plane doping)=$10^{18}$ cm$^{-3}$ $N_S$ (doping of the substrate layer)=$3*10^{15}$ cm$^{-3}$. The substrate layer 101 could have a same type of doping as the ground plane 102 with a much lower doping level. The substrate layer 101 could have a P type doping.

The source potential is referenced at 0V.

The channel 104 is weakly doped (equivalent of the $N_S$ doping of the substrate).

FIG. 3 illustrates the variation of the threshold voltage for an nMOS transistor as a function of different parameters. For reference, FIG. 3 also illustrates the threshold voltage of an nMOS transistor devoid of any ground plane (curve referenced W/O GP). The two parameters influencing the threshold voltage of the tested transistors are: thickness of the insulator layer (Tbox) and the bias of the ground plane relatively to the source (Vbg-s designates the voltage between the ground plane and the source). In the left-hand graph, the doping of the ground plane is opposite that of the drain and of the source of its transistor (P+ doping of the ground plane for an nMOS transistor whose source and drain have N doping). In the right-hand graph, the doping is identical (N+ doping of the ground plane for an nMOS transistor whose source and drain have N doping). For a given thickness of insulator layer, it can be noted that the threshold voltage of the transistor with opposite doping varies over a first range as a function of the bias voltage, while the threshold voltage of the transistor with identical doping varies over a second range as a function of the bias voltage. For a 20 nm thickness of insulator layer, the first range extends from 430 mV to 600 mV and the second range extends from 200 mV to 460 mV. The upper value of the first range is greater than the upper value of the second range. When one and the same reference voltage is applied between the ground plane and the source of the transistors at identical doping and opposite doping, the threshold voltage of the transistor with opposite doping is greater than the threshold voltage of the transistor with identical doping.

It can also be seen that the amplitude of the first and second ranges increases when the thickness of the insulator layer is reduced. The finer the insulator layer, the greater the increase in the top value of the first range and the greater the drop in the bottom value of the second range.

For a given thickness of the insulator layer and with a given type of doping of the ground plane, the threshold voltage of the transistors varies respectively in the first and second ranges. A drop in the potential difference between the ground plane and the source induces a rise in the threshold voltage of the transistors.

With a fine insulator layer, an opposite doping (P+ doping of the ground plane for an nMOS transistor) and a reduced voltage difference between the ground plane and the source, the threshold voltage of the transistor is appreciably increased relatively to the reference transistor without any ground plane. Such a raised threshold voltage will hereafter be designated as Vth. With a thin insulator layer, an identical doping (N+ doping of the ground plane for a nMOS transistor) and a voltage difference of Vdd between the ground plane and the source, the threshold voltage of the transistor is appreciably diminished relatively to the reference transistor without ground plane.

In the other cases (identical doping with Vbg-s=0 or opposite doping with Vbg-s=Vdd), the threshold voltage is modified to a lesser extent relatively to the reference transistor without ground plane, even with a very small thickness of the insulator layer. The threshold voltage of the reference transistor will serve as a reference voltage and will be designated by the term "standard threshold voltage" Vt. In the example illustrated in FIG. 3, the standard voltage Vt of the nMOS transistor ranges from 460 to 480 mV according to the thickness of the insulator layer.

An increase in the difference in potential between the ground plane and the source of a threshold voltage transistor Vth brings the threshold voltage of this transistor close to the standard threshold voltage Vt. A change in type of doping of the ground plane of a transistor with a threshold voltage Vth leads to a transistor with a standard threshold voltage Vt.

Although FIG. 3 illustrates the working of the nMOS transistors, similar results are obtained for pMOS transistors. The voltages Vth, Vtl and Vts of the nMOS and pMOS transistors could be slightly different for one and the same thickness of insulator layer.

It is possible for example to consider that a threshold voltage is of a Vth or Vtl type if it is different by at least 5% from the standard threshold voltage Vts, preferably at least 10% or even 20%. A threshold voltage could also be considered to be of a Vth or Vtl type if it differs by only 30 mV from the standard threshold voltage Vts, preferably at least 40 mV or even at least 60 mV.

FIG. 4 provides a synthesis of the variations in threshold voltage obtained for a thin insulator layer as a function of the bias and of the doping of the ground plane respectively for an nMOS transistor and for a pMOS transistor.

Vth corresponds to a raised threshold voltage, Vtl corresponds to a lowered threshold voltage and Vt corresponds to a standard threshold voltage. Gp-n designates a ground plane whose doping is of an n type, Gp-p designates a ground plane whose doping is of a p type.

To obtain an nMOS transistor with a lowered threshold voltage Vtl, a difference in potential Vdd is applied between the ground plane having an n type doping and the source. To obtain an nMOS transistor with a raised threshold voltage Vth, the bias of the source is applied to a ground plane with a p type doping. To obtain a pMOS transistor with raised threshold voltage Vth, the bias of the source is applied to a ground plane with an n type doping. To obtain a pMOS transistor with a lowered threshold voltage Vtl, a potential difference Vdd is applied between the ground plane having a p type doping and the source.

FIG. 5 illustrates the progress of the conduction current of an nMOS transistor as a function of the different parameters. Three parameters influence the conduction current of the tested transistors: the thickness of the insulator layer, the bias of the ground plane and the doping of the ground plane. The conduction current of a reference transistor without ground plane is also illustrated. A doping of the ground plane opposite that of the drain and the source reduces the conduction current while a doping identical to that of the drain and the source increases the conduction current. The greater the difference in potential between the ground plane and the source, the greater is the conduction current. The variation of the parameters tested gives an increase in the conduction current reaching up to 200 μA/μm for an insulator layer with a thickness of 20 nm. The variation of the tested parameters also makes it possible to diminish the conduction current attaining 130 μA/μm for an insulator layer with a thickness of 20 nm. Similar results are obtained with the pMOS transistor.

FIG. 6 illustrates the progress of the leakage current as a function of the different parameters for an nMOS transistor. Three parameters influence the leakage current of the tested transistors: the thickness of the insulator layer, the bias of the ground plane and the doping of the ground plane. The leakage current of a reference transistor without ground plane is also illustrated. A doping of the ground plane opposite that of the source associated with a reduced difference in potential between the ground plane and the source (threshold voltage Vth) reduces the leakage current relatively to the reference transistor. A doping of the ground plane identical to that of the source associated with the potential difference Vdd between the ground plane and the source (threshold transistor Vtl) increases the leakage current relatively to the reference transistor. For an insulator layer smaller than 50 nm, the variation of the tested parameters thus gives a modulation ranging from 2 to 6 decades of the leakage current between a transistor with a threshold Vth and a transistor with a threshold Vtl.

The dashed lines in FIGS. 3, 5 and 6 represent the boundary between what will be considered to be a thin insulator layer and a thick insulator layer. For the dimensions of the transistors implemented in these simulations, this boundary is approximately 50 nm. It can be seen indeed that the variations of the threshold voltages or of the conductive currents become significant relatively to the reference transistor without ground plane when the thickness of the insulator layer is smaller than 50 nm.

With L being the gate length of the transistor, the thickness Tbox of the insulator layer will thus advantageously be chosen according to the following rule: Tbox<L. There is thus an empirical rule available to determine a thin insulator layer as a function of the dimensions of the transistor.

Although the tests have been made with a ground plane having a doping of $10^{18}$ cm$^{-3}$, a doping ranging between $2*10^{17}$ cm$^{-3}$ and $5*10^{18}$ cm$^{-3}$ could be used.

Although the graphs of FIGS. 3, 5 and 6 have been made for an nMOS transistor, similar conclusions are obtained for a pMOS transistor. Owing to the inverse logic of the pMOS transistors, with a thin insulator layer, we obtain an increase in the absolute value of the threshold voltage for a doping of the ground plane opposite that of the source, and with a reduced potential difference between the source and the ground plane. The leakage current and conduction current of the pMOS transistor are then reduced. With a thin insulator layer, we obtain a reduction of the absolute value of the threshold voltage of the pMOS transistor with an identical type of doping between the source and the ground plane, and with a raised potential difference between the source and the ground plane. The leakage and conduction currents of the pMOS transistor are then raised.

The use of these properties of modulation of the parameters of the transistors proves to be particularly advantageous in an integrated circuit according to the invention.

FIG. 7 represents the electrical drawing of a 4T-type memory cell 2 according to the invention. Two nMOS type driver transistors $MD_L$ and $MD_R$ are connected so as to form a bistable flip-flop circuit in a manner known per se. The driver transistors $MD_L$ and $MD_R$ are made in active silicon layers. The active silicon layers surmount an insulator layer placed above a ground plane. The ground plane of the driver transistors is connected to ground. The memory cell 2 has two pMOS type access transistors $MA_L$ and $MA_R$. The access transistors $MA_L$ and $MA_R$ are in active layers of silicon. The active layers of silicon surmount an insulator layer made above a ground plane. The ground plane of the access transistors is connected to ground. The source of the access transistors $MA_L$ and $MA_R$ is connected respectively to the bit lines $BL_L$ and $BL_R$ respectively. The gate of the access transistors $MA_L$ and $MA_R$ is connected to a word line WL. The source of the driver transistors $MD_L$ and $MD_R$ is connected to ground. The drain of the driver transistors $MD_L$ and $MD_R$ is connected to the respective drain of the access transistors $MA_L$ and $MA_R$.

The function of the driver transistors $MD_L$ and $MD_R$ is to maintain the storage node at a logic level 0 close to the ground potential in retention. The function of the access transistors $MA_L$ and $MA_R$ is to maintain the logic level 1 storage node close to the potential Vdd in retention and enable access to the potentials of the storage nodes during the read and write cycles.

The ground planes made beneath the transistors $MD_L$ and $MD_R$ and $MA_L$ and $MA_R$ are connected to ground. A potential difference of Vdd is applied between the source and the ground plane of the access transistors $MA_L$ and $MA_R$ as will be seen here below. A zero potential difference is applied between the source and the ground plane of the driver transistors $MD_L$ and $MD_R$. The (P+) doping of the ground plane of the access transistors $MA_L$ and $MA_R$ (pMOS) is identical to the doping of their source. The (P+) doping of the ground plane of the (nMOS) driver transistors $MD_L$ and $MD_R$ is opposite to the doping of their source. The memory cell is advantageously made with pMOS-type access transistors and nMOS-type driver transistors because the wafers are usually provided with default P type doping, thus making it easier to form a ground plane with P+ doping which is appropriate to the modulation of the threshold voltages of these transistors. The insulator layer on which the transistors $MD_L$ and $MD_R$ and $MA_L$ and $MA_R$ are made is thin as understood in the invention, i.e. its thickness enables the threshold voltages of the transistors $MD_L$ and $MD_R$ and $MA_L$ and $MA_R$ to be made to vary with the doping and bias values applied to their ground plane. The driver transistors $MD_L$ and $MD_R$ thus have a raised threshold voltage Vth. The access transistors $MA_L$ and $MA_R$ thus have a lowered threshold voltage Vtl.

The access transistors $MA_L$ and $MA_R$ can use a common ground plane since this plane can have the same type of doping and the same bias. Similarly, the driver transistors $MD_L$ and $MD_R$ can use a common ground plane since this ground plane can have the same type of doping and the same bias. The ground plane can even be common to the access transistors and to the driver transistors since it has the same bias and the same type of doping for all these transistors.

In data retention mode, the bit lines $BL_L$ and $BL_R$ and the word line WL are biased at the power supply potential Vdd. The access transistors $MA_L$ and $MA_R$ are then in the off state. In the example shown, the driver transistor $MD_L$ is also in an off state unlike the transistor $MD_R$.

The condition for keeping the potential of the node L close to Vdd and thus keeping the logic level at 1 is that the leakage current flowing through the access transistor $MA_L$ ($I_{mal\text{-}off}$) should be greater by at least 2 to 3 decades than the sum of the leakage current flowing the driver transistor $MD_L$ ($I_{mdl\text{-}off}$) and that drawn by the gate of the transistor $MD_R$ ($I_{mdr\text{-}g}$):

$$I_{MAL\text{-}OFF} >> I_{MDL\text{-}OFF} + I_{MDR\text{-}G}$$

The proposed memory cell 2 makes it possible to meet this condition: the access transistors $MA_L$ and $MA_R$ have a lowered threshold voltage Vtl (see FIG. 4) which increases their leakage current while the driver transistors $MD_L$ and $MD_R$ have a raised threshold voltage Vth (see FIG. 4) which enables their leakage current (see FIG. 5) to be reduced. Compliance with the condition of maintaining the potential of a node at the level Vdd in retention mode is thus facilitated. FIG. 8 (drain current as a function of the gate voltage) shows especially that, with appropriate gate lengths Lg for the driver transistors $MD_L$ and $MD_R$ and the access transistors $MA_L$ and $MA_R$ (55 nm and 45 nm respectively), the condition on the leakage currents is easily met since a difference of 2.5 decades is obtained between the conduction currents of the access transistors and those of the driver transistors.

It is then not necessary to provide for additional data refresh circuits in the storage nodes of the memory cell 2. The control of the threshold voltage of the different transistors can be done simply on all the cells by the structure of these cells and by the appropriate biasing of the ground planes. The complexity of the circuit integrating the memory cell 2 can thus be reduced and its density can be increased. It is also possible to prevent the use of circuits dynamically modifying the threshold voltage of the transistors of these cells, which calls for the presence of substrate contacts at the cell. The complexity of the circuit integrating the memory cell 2 can thus be reduced and its density can be increased.

In read mode, the bit lines $BL_L$ and $BL_R$ are preliminarily charged at Vdd, and then the word line is biased at Vss (or at a higher potential) to make the transistors $MA_L$ and $MA_R$ conductive and thus enable access to the storage nodes of the memory cell 2.

The stability of the memory cell 2 in read mode depends on the relationship between the conduction currents of the driver transistors and access transistors connected to the storage node with a logic level 0. In the example of FIG. 7, the condition laid down for keeping the potential of the node R close to Vss (logic level 0) is that the conduction current that flows through the access transistor $MA_R$ ($I_{mar-on}$) should be smaller (by at least a factor of 2 to 3) than the conduction current of the transistor $MD_R$ ($I_{mdr-on}$):

$$I_{MAR-ON} < I_{MDR-ON}$$

The condition of stability of the node at the logic level 0 in read mode is obtained by a sizing of the gate width (Wd) of the driver transistors to make it greater than that of the access transistors.

To optimize the stability in retention of a 4T-type memory cell, it is usual to increase the conductance of the pMOS transistors and to reduce the conductance of the nMOS transistors. This optimizing runs counter to the optimizing of the stability in read mode, and this entails a trade-off in sizing. Since the pMOS transistors are intrinsically less conductive than the nMOS transistors and since the modulation of the conduction currents of the transistors is lower than the modulation of the leakage currents with the parameters of the transistors according to the invention, the stability in read mode of the memory cell 2 can be optimized by an appropriate sizing of the transistors. The stability in read mode can also be optimized by applying a voltage greater than Vss to the word line during a read access to the memory cell 2. The pMOS-type access transistors are then made less conductive to facilitate compliance with the condition of stability in read mode.

Figure 9:
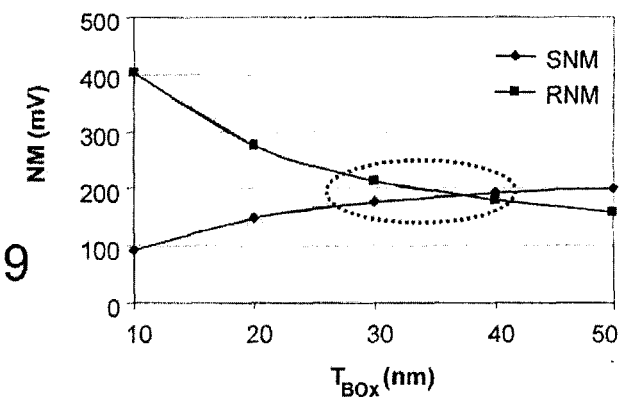
FIG. 9 is a graph representing the margin of stability of a memory cell in read mode and in retention mode as a function of the thickness of the insulating layer.
Figure 10:
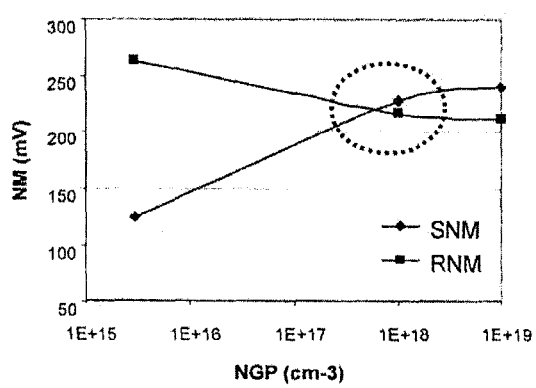
FIG. 10 is a graph representing the margin of stability of a memory cell in read mode and in retention mode as a function of the doping of the ground plane.

The trade-off between stability in retention and stability in reading of the memory cell 2 can be optimized as a function of the thickness of the insulator layer and of the doping of the ground plane, as can be seen in the graphs of FIGS. 9 and 10. These graphs demarcate a zone of optimization in the part shown in dots, both for the thickness Tbox of the insulator layer (FIG. 9) and for the $N_{GP}$ doping of the ground plane (FIG. 10) for the following transistor parameters:

$V_{DD}$=1V
L (gate width)=45 nm
$T_{Si}$ (channel thickness)=8 nm
$N_{GP}$ (doping of the ground plane)=$10^{18}$ cm$^{-3}$
$N_S$ (doping of the substrate layer)=$3*10^{15}$ cm$^{-3}$
The source potential is referenced at 0V.

The curves SNM correspond to the stability in read mode while the curves RNM correspond to the stability in retention.

In write mode, a potential difference is applied between the bit lines $BL_L$ and $BL_R$. The word line is then biased at Vss to make the access transistors $MA_L$ and $MA_R$ conductive. Depending on the potential difference applied between the bit lines $BL_L$ and $BL_R$, the cell switches over: if the bit line $BL_L$ is in the logic state 0 and the bit line $BL_R$ is in the state 1, then the node L passes to 0 and the node R passes to 1.

Although the test made corresponds to an FDSOI technology, similar results can be obtained with technologies known as localized FDSOI and "Silicon On Nothing" technology.

Figure 11:
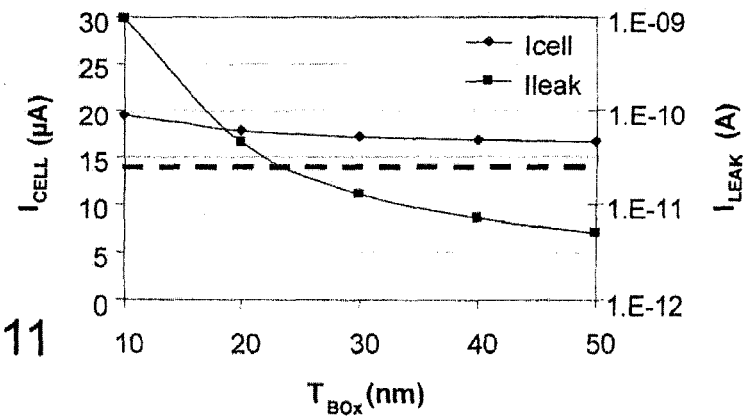
FIG. 11 is a graph representing the read current of the cell and the leakage current consumed as a function of the thickness of the insulator layers.

The graph of FIG. 11 illustrates the variation of the current consumed by the cell in retention mode ($I_{leak}$) and of the cell current ($I_{cell}$) as a function of the thickness Tbox of the insulator layer according to a simulation. The dashed line illustrates a maximum limit of current leakage which may be chosen to determine the sizing of the transistors. A 30 nm thickness of the insulator layer proves to be appropriate. The thickness of the insulator layer could naturally be adapted to the size of the transistors. Thus, it is possible to envisage adapting the thickness Tbox of the insulator layer approximately as follows: Tbox<L.

The topology of the memory cell, illustrated by FIG. 13, has been drawn from these pieces of data on sizing. FIG. 14 gives a second example of a drawing of the same cell. In this example, the topology is aimed at ensuring that the stability of the memory cell in read mode and in retention reaches at least 20% of the voltage Vdd (giving 200 mV with Vdd=1V). The cell was designed for low current consumption applications (about 10 pA per cell). Simulations have made it possible to determine that a width of the driver transistors (Wd) of at least 115 nm proves to be satisfactory to ensure that the stability in read mode and in retention mode will attain the threshold of 20% of the voltage $V_{DD}$. Rules of sizing for SRAM memories in 45 nm have been used, for example the rules defined in the document by M Bouef in "0.248 µm$^2$ and 0.334 µm$^2$ *Conventional Bulk 6T-SRAM bit-cells for 45 nm node Low Cost-General Purpose Applications*", Symposium on VLSI, Technology Digest of Technical Papers, 2005. Thus the following sizing parameters have been used: Wd=115 nm, Ld=55 nm (gate length of the driver transistor), Wa=55 nm (gate length of the access transistor) and La=45 nm (gate length of the access transistor).

The table of FIG. 12 illustrates the electrical results obtained. An excellent trade-off has been noted between stability in read mode and in retention mode. The write margin (Wm) defined by the potential difference needed between the bit lines during a write operation proves to be very low thus ensuring excellent cell writing capacity. The surface area S occupied by the cell is also very limited.

The ground planes of the transistors can be connected together by the silicon substrate layer. FIG. 15 illustrates the topology of a matrix 31 of 4×4 memory cells 2. The substrate layer is connected to ground by substrate connectors 31. It is possible however to envisage the connection of the substrate layer to ground by means of its rear face.

It is possible to envisage biasing the substrate layer of the cell through external voltage sources in order to modulate the threshold voltage of the transistors. FIG. 16 illustrates a voltage range to be complied with in the zone demarcated by the dashed line. For example, if the P type substrate is biased at 0V, the N type well would have to show a bias voltage of 0V to Vdd. Thus, the invention prevents the forward biasing of the PN junction which could generate a major DC current causing leakages from the memory cell 2.

FIG. 17 is an electrical drawing of a variant of a 4T-type memory cell 2 made by inverse logic. In this example, the memory cell 2 has pMOS-type load transistors $ML_L$ and $ML_R$ storing the storage nodes and nMOS-type access transistors $MA_L$ and $MA_R$. The access transistors $MA_L$ and $MA_R$ are formed on a thin insulator layer surmounting a ground plane presenting a potential difference Vdd with their source and having an N+ doping (doping identical to that of the source). The charge transistors $ML_L$ and $ML_R$ are formed on a thin insulator layer surmounting a ground plane presenting a zero potential difference with their source and having an N+ doping (doping opposite that of the source). The access transistors $MA_L$ and $MA_R$ thus have a lowered threshold voltage Vtl while the load transistors $ML_L$ and $ML_R$ have a raised threshold voltage Vth (see FIG. 4). The conditions of stability in read mode and in retention mode are therefore in this way more easily met with this memory cell 2 in inverse logic.

Figure 29:
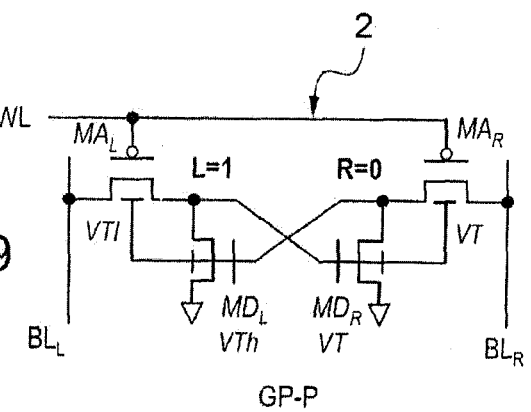
FIG. 29 is an electric diagram of a 4T-type memory with dynamic bias of the ground planes.

FIG. 29 shows the electrical drawing of a 4T-type memory cell 10 in which the ground planes show a dynamic bias. Two driver transistors $MD_L$ and $MD_R$ of an nMOS type are connected so as to form the bistable flip-flop circuit with two storage nodes R and L. The driver transistors $MD_L$ and $MD_R$ surmount an insulating layer made above a ground plane with P+ doping. The memory cell 10 has two pMOS type access transistors $MA_L$ and $MA_R$. The access transistors $MA_L$ and $MA_R$ surmount this insulator layer made above a ground plane with P+ doping. The ground planes of the transistors $MD_L$ and $MA_L$ are connected to the gate potential of the transistor $MD_L$. The ground planes of the transistors $MD_R$ and $MA_R$ are connected to the gate potential of the transistor $MD_R$. In the example illustrated, the storage node L stores a value of 1 while the storage node R stores a value of 0. The potential applied to a ground plane of the transistors $MD_L$ and $MA_L$ is therefore at ground. The threshold voltage of the transistor $MD_L$ is therefore at Vth while the threshold voltage of the transistor $MA_L$ is at Vtl (see FIG. 4). The potential applied to the ground plane of the transistors $MD_R$ and $MA_R$ is therefore at Vdd. The threshold voltage of the transistor $MD_L$ is therefore at Vt and the threshold voltage of the transistor $MA_L$ is also at Vt (see FIG. 4). Thus, the invention ensures firstly the stability in retention of the node L at 1 with appropriate respective leakage currents for $MD_L$ and $MA_L$ and secondly reduced consumption for the transistor $MA_R$ which has a threshold voltage greater than that of the transistor $MA_L$: this greater threshold voltage is not detrimental to the working of the cell 10 since the retention of the node R at 0 does not dictate the same conditions on the leakage currents.

The main steps of an example of a method for manufacturing an FDSOI type integrated circuit including such memory cells could be the following: starting with an SOI-type wafer, a layer of insulator more than 140 nm thick can be refined by thermal oxidation and wet etching. Insulating trenches are then formed. Load planes with appropriate doping values are then implanted beneath the nMOS and pMOS transistors. A dielectric with high dielectric constant such as $HfZrO_2$ is deposited with a thickness of approximately 2.5 nm. A metal gate (for example made of ALD TiN with a thickness of 20 nm) and an 80 nm layer of polysilicon are deposited to form the gate stack. A 193 nm lithography operation combined with an etching attack are used to obtain the desired gate dimensions. 10 nm offsetting spacers are made and then a selective epitaxial growth of 10 nm is performed in the extension regions in order to reduce the access resistance. Raised extensions undergo an implantation. Then, a Dshape type spacer is made, and the source and the drain (activated by an "RTP spikes anneal" type process at 1080° C.) are implanted, and then a silicization step (NiPtSi) is performed. Layers of nitride can be added to improve performance.

The invention can also be applied in 6T-type memory cells which are theoretically faster and have a lower integration density than 4T-type memory cells. The 6T-type memory cells are also theoretically more stable in retention mode and show a more reduced writing margin.

FIG. 18 is an electrical drawing of a 6T-type memory cell 4 of an integrated circuit according to the invention. The memory cell 4 of FIG. 18 is designed to optimize electrical consumption. In a manner known per se, the memory cell 4 has two nMOS-type access transistors $MA_L$ and $MA_R$, two nMOS-type driver transistors $MD_L$ and $MD_R$ and two pMOS-type load transistors $ML_L$ and $ML_R$. The driver transistors $MD_L$ and $MD_R$ and the load transistors $ML_L$ and $ML_R$ are connected in a manner known per se to form a bistable flip-flop circuit having storage nodes L and R. The storage nodes L and R are selectively connected to the voltage Vdd respectively by means of the load transistors $ML_L$ and $ML_R$. The storage nodes L and R are selectively connected to ground respectively by means of the driver transistors $MD_L$ and $MD_R$. The storage nodes L and R are selectively connected to the bit lines $BL_L$ and $BL_R$ respectively by means of the access transistors $MA_L$ and $MA_R$. The gate of the access transistors $MA_L$ and $MA_R$ is connected to a word line WL. The gate of the load transistor $ML_L$ and the gate of the driver transistor $MD_L$ are connected to the storage node R. The gate of the load transistor $ML_R$ and the gate of the driver transistor $MD_R$ are connected to the storage node L. The use of the nMOS-type access transistors $MA_L$ and $MA_R$ theoretically enables access to the storage nodes of the memory cell 4 that is faster than with a memory cell according to FIG. 7.

Figure 19:
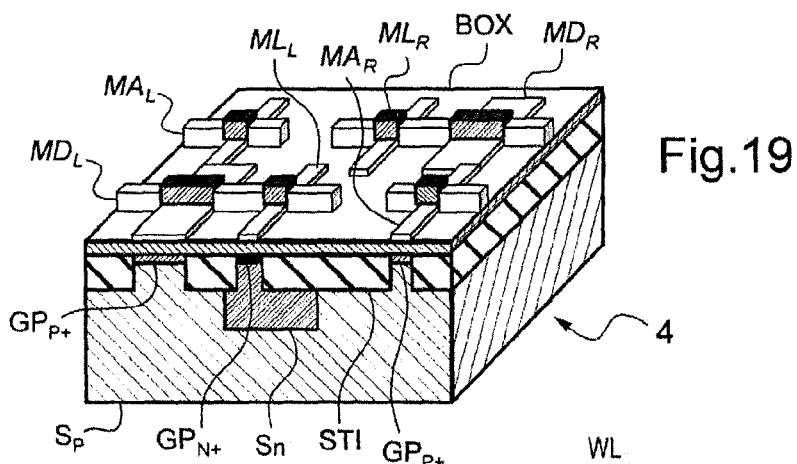
FIG. 19 is a view in perspective of the memory cell of FIG. 18 according to an example of topology.

As illustrated in the topology shown in a cross-section in FIG. 19, the nMOS transistors $MA_L$ and $MD_L$ are made on an insulator layer BOX and overhang a ground plane $GP_{P+}$. The nMOS transistors $MA_R$ and $MD_R$ are made on a thin insulator layer BOX overhanging another ground plane $GP_{P+}$. The doping of the ground planes $GP_{P+}$ is opposite that of the source of the nMOS transistors. The ground planes $GP_{P+}$ are connected to the ground potential. The potential difference between these ground planes and the source of their nMOS transistors is therefore zero. Consequently, a raised threshold voltage Vth is obtained for the nMOS transistors (see table of FIG. 4).

The pMOS-type load transistors $ML_L$ and $ML_R$ are made on the insulator layer BOX and overhang a ground plane $GP_{N+}$. The doping of the ground planes $GP_{N+}$ is opposite that of the source of the pMOS transistors $ML_L$ and $ML_R$. A zero potential difference between the ground plane $GP_{N+}$ and the source of the transistors $ML_L$ and $ML_R$ is applied. Consequently, a raised threshold voltage Vth is obtained for the pMOS transistors (cf. table of FIG. 4).

FIG. 20 shows a topology of a matrix 5 of 4×4 memory cells 4. The references 52 designate the P+ type ground planes. The ground planes 52 are biased by means of the contact points 51. The references 54 designate the N+ type ground planes. The ground planes 54 are biased by means of contact points 53. In the legend, the zones identified by M1 correspond to the metallization zones. The zones identified by Gr correspond to gates. The zones identified by Zd correspond to diffusion zones. The zones identified by Sn correspond to implantations of N type substrate wells. To gain in integration density, the electrical connection of the N and P type substrate layers is made on the periphery of the matrix, outside the memory cell 6. In order to simplify the making of the memory cells 4, the load transistors $ML_L$ and $ML_R$ overhang a same ground plane $GP_{N+}$.

Figure 21:
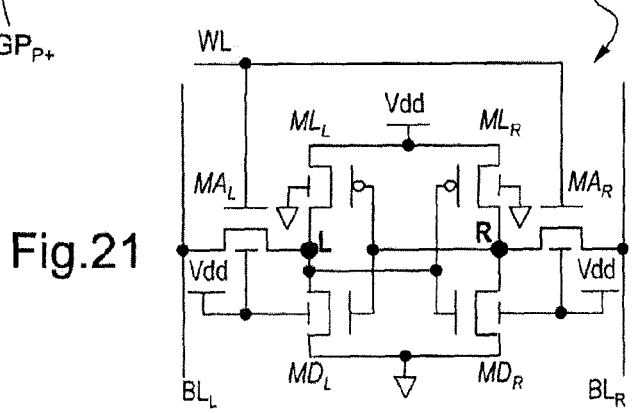
FIG. 21 is an electric diagram of another example of a 6T-type memory cell integrated into a circuit according to the invention.
Figure 22:
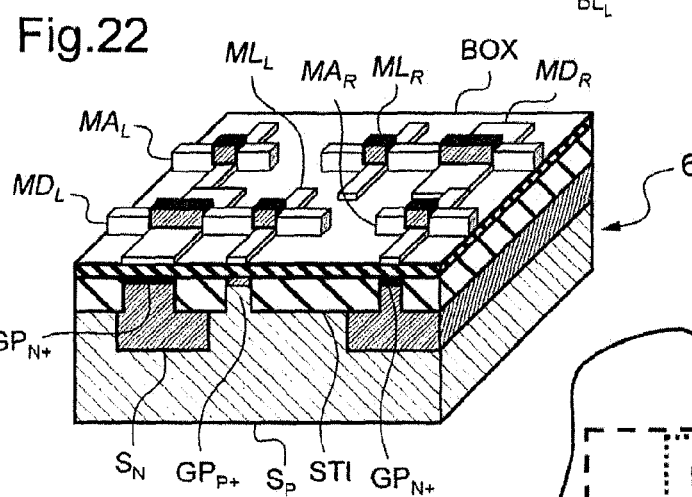
FIG. 22 is a view in perspective of the memory cell of FIG. 21 according to an example of topology.

FIG. 21 is an electrical drawing of a 6T-type memory cell 6 of an integrated circuit according to the invention. The memory cell 6 of FIG. 22 is designed to optimize the access time to the storage nodes L and R. In a manner known per se, the memory cell 6 includes two nMOS-type access transistors $MA_L$ and $MA_R$, two nMOS-type driver transistors $MD_L$ and $MD_R$ and two pMOS-type load transistors $ML_L$ and $ML_R$. The driver transistors $MD_L$ and $MD_R$ and the load transistors $ML_L$ and $ML_R$ are connected to form a bistable flip-flop circuit presenting the storage nodes L and R. The storage nodes L and R are selectively connected to the voltage Vdd respectively by means of load transistors $ML_L$ and $ML_R$. The storage nodes L and R are selectively connected to ground respectively by means of driver transistors $MD_L$ and $MD_R$. The storage nodes L and R are selectively connected to bit lines $BL_L$ and $BL_R$ respectively by means of the access transistors $MA_L$ and $MA_R$. The gate of the access transistors $MA_L$ and $MA_R$ is connected to a word line WL. The gate of the load transistor $ML_L$ and the gate of the driver transistor $MD_L$ are connected to the storage node R. The gate of the load transistor $ML_R$ and the gate of the driver transistor $MD_R$ are connected to the storage node L. The use of the nMOS type access transistors $MA_L$ and $MA_R$ theoretically provides faster access to the storage nodes of the memory cell 6 than with a memory cell according to FIG. 7.

As illustrated in the topology shown in a cross-section in FIG. 22, the nMOS transistors $MA_L$ and $MD_L$ are made on an insulator layer BOX and overhang a ground plane $GP_{N+}$. The nMOS transistors $MA_R$ and $MD_R$ are made on a thin insulator layer BOX overhanging another ground plane $GP_{N+}$. The doping of the ground planes $GP_{N+}$ is identical to that of the source of the nMOS transistors. The ground planes $GP_{N+}$ are connected to the potential Vdd. The potential difference between these ground planes and the source of the nMOS transistors is therefore Vdd. Consequently, a lowered threshold voltage Vtl is obtained for the nMOS transistors (cf table of FIG. 4).

The pMOS-type load transistors $ML_L$ and $ML_R$ are made on the insulator layer BOX and overhang a ground plane $GP_{P+}$. The doping of the ground planes $GP_{P+}$ is identical to that of the source of the pMOS transistors $ML_L$ and $ML_R$. A potential difference of Vdd between the ground plane $GP_{P+}$ and the source of the transistors $ML_L$ and $ML_R$ is applied. Consequently, a lowered threshold voltage Vtl is obtained for the pMOS transistors (cf. table of FIG. 4).

FIG. 23 shows a topology of a matrix 7 of 4×4 memory cells 6. The references 72 designate the P+ type ground planes. The ground planes 72 are biased by means of the contact points 71. The references 74 designate the N+ type ground planes. The ground planes 74 are biased by means of contact points 73. In the legend, the zones identified by M1 correspond to metallization zones. The zones identified by Gr correspond to gates. The zones identified by Zd correspond to diffusion zones. The zones identified by Sn correspond to implantations of N type substrate wells.

The following table gives the results of simulations made for a memory cell 4 and a memory cell 6.

| Cell: | SNM (mV) | RNM (mV) | $I_{CELL}$ (µA/µm) | $I_{LEAK}$ (pA/µm) |
|---|---|---|---|---|
| 6 | 195 | 339.8 | 26.5 | 15092 |
| 4 | 274.6 | 441.9 | 11.8 | 0.235 |

As expected, it can be seen that the leakage current of a cell 4 is far lower than the leakage current of a cell 6. The memory cell 4, provided with transistors with raised threshold voltages thus has limited electrical consumption in retention. The leakage current of the memory cell 6 could however be reduced by increasing the thickness of the insulating layer BOX. Furthermore, this memory cell 4 has stability in reading and writing greater than that of the memory cell 6. As expected, it can also be seen that the current for reading the memory cell 6 is greater than the current for reading the memory cell 4. Consequently, the speed of access to the storage nodes of the cell 6 is greater.

The invention thus makes it possible, on one and a same integrated circuit, to make two types of memory cells having distinct properties using a same technology, in essentially providing different doping and biasing values for the ground planes of the transistors of these memory cells. Although the examples of memory cells of FIGS. 18 and 21 use pMOS-type load transistors $ML_L$ and $ML_R$ and nMOS type access transistors $MA_L$ and $MA_R$ and two nMOS type driver transistors $MD_L$ and $MD_R$, the 6T-type memory cells can also be made using inverse logic.

The memory cells 4 with low consumption and the fast access memory cells 6 will be integrated for example into a memory circuit. The memory cells 4 could be used for low-consumption applications and the memory cell 6 could be used for applications requiring a greater computation bandwidth.

The invention can advantageously be applied to integrated circuits comprising logic gates that require distinct electrical properties.

Figure 24:
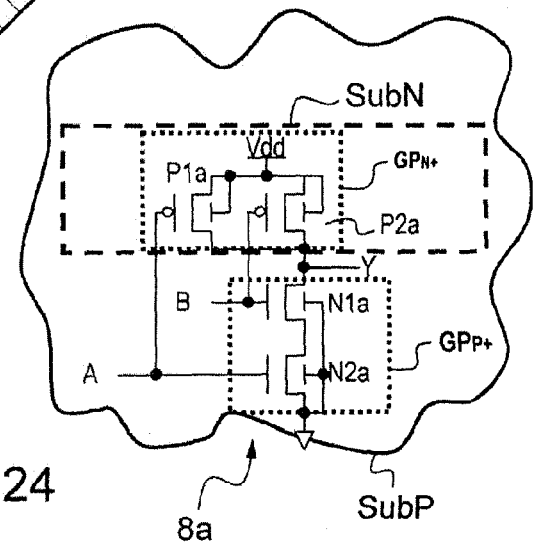
FIG. 24 is an electric diagram of an example of a logic gate integrated into the substrate of a circuit according to the invention.

FIG. 24 is an electrical diagram of a logic gate 8a designed to show reduced electrical consumption. pMOS transistors P1a and P2a and nMOS transistors N1a and N2a are connected in manner known per se to form a NAND2 gate having an output terminal Y. Control terminals A and B respectively control the gates of the transistors P1a, N2a and P2a, N1a. The pMOS and nMOS transistors overhang a fine layer of insulator, enabling the modulation of the threshold voltages as described in detail here above. The pMOS transistors are made on a substrate subN with N type doping, this substrate being implanted in the form of a well in a default P type substrate. The pMOS transistors are made overhanging a ground plane GPn+ whose doping is N type doping. The difference in potential between the ground plane GPn+ and the source of the pMOS transistors is zero. Consequently, the pMOS transistors have a high threshold voltage (see FIG. 4). The nMOS transistors are made on a substrate subP whose doping is P type doping. The nMOS transistors are made over a ground plane GPp+ whose doping is P type doping. The difference in potential between the ground plane GPp+ and the source of the nMOS transistors is substantially zero. Consequently, the nMOS transistors have a raised threshold voltage (cf. FIG. 4).

FIG. 25 shows an example of a drawing for the logic gate 8a. The zones identified by Ps correspond to electrical substrate contacts. In this example, the electrical substrate contacts are implemented in the cell of the logic gate and are directly connected to Vdd or to ground. The electrical substrate contacts can also be made outside the cell in order to increase the density in logic gates of the integrated circuit. The zone Met corresponds to a metallization zone. The zone Zdif corresponds to a diffusion zone. The zone G corresponds to the gate of the transistors. The zone Ct corresponds to contacts. The part overhanging the ground plane GPp+ corresponds to the nMOS transistors while the part overhanging the ground plane GPn+ corresponds to the pMOS transistors.

FIG. 26 is an electrical diagram of a logic gate 8b designed to present a high conduction current. pMOS transistors P1b and P2b and nMOS transistors N1b and N2b are connected in a manner known per se to form a NAND2 gate having an output terminal Y. Control terminals A and B respectively control the gates of the transistors P1b, N2b and P2b, N1b. The pMOS and nMOS transistors overhang a fine insulator layer enabling the modulation of their threshold voltage as described in detail here below. The pMOS transistors are made on a substrate subP whose doping is P type doping. The pMOS transistors are made over a ground plane GPp+ whose doping is P type doping. The potential difference between the ground plane GPp+ and the source of the pMOS transistors is Vdd (connection of the substrate to the ground). Consequently, the pMOS transistors have reduced threshold voltage (see FIG. 4). The nMOS transistors are made on a substrate subN whose doping is N type doping, this substrate being implanted in the P type substrate. The nMOS transistors are placed over a ground plane GPn+ whose doping is N type doping. The difference in potential between the ground plane GPn+ and the source of the nMOS transistors is Vdd (connection of the substrate to Vdd). The nMOS transistors therefore have a lowered threshold voltage (cf. FIG. 4).

Figure 27:
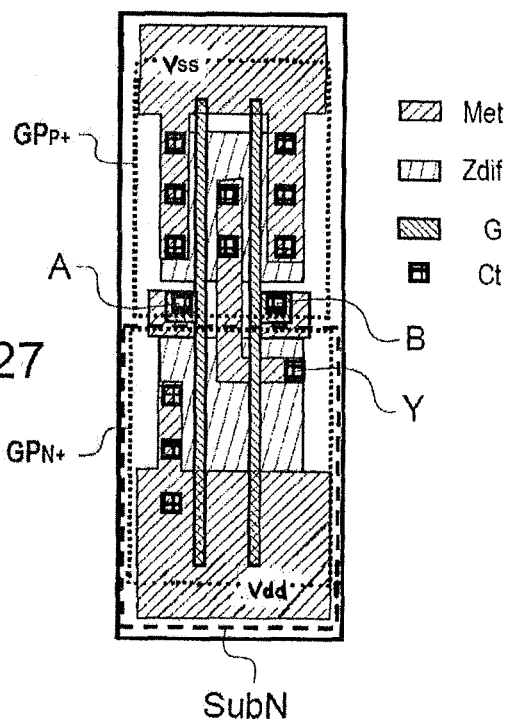
FIG. 27 is a topology of the logic gate of FIG. 26.

FIG. 27 shows an example of topology for the logic gate 8b. The zone Met corresponds to a metallization zone. The zone Zdif corresponds to a diffusion zone. The zone G corresponds to the gate of the transistors. The zone Ct corresponds to contacts. The part overhanging the ground plane GPn+ corresponds to the nMOS transistors while the part overhanging the ground plane GPp+ corresponds to the pMOS transistors.

Figure 28:
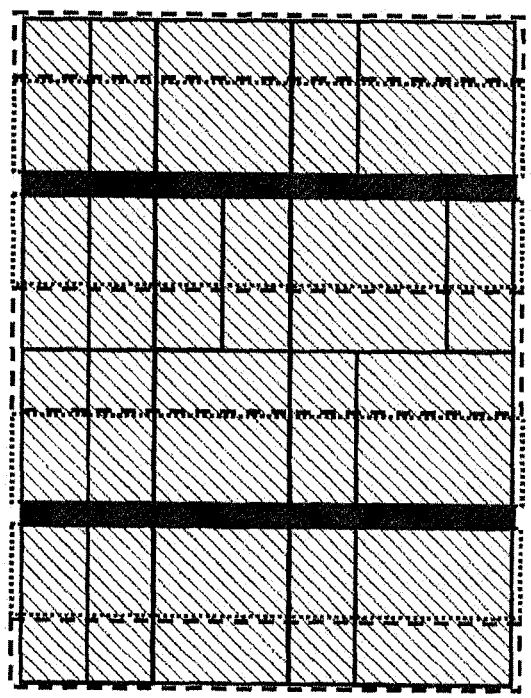
FIG. 28 is a schematic representation of an integrated circuit comprising logic gates according to FIG. 2 and logic gates according to FIG. 26.

FIG. 28 is a schematic view of the layout of different logic gates of these two different types on an integrated circuit 9. The logic gates or cells Cel can be made so as to form strips having a same type of transistor laid out in a common ground plane. Rows of logic cells are separated by electrical contact zones Ps. There is thus a P doped ground plane strip overhung by nMOS transistors, a P doped ground plane strip overhung by pMOS transistors, an N doped ground plane strip overhung by nMOS transistors and an N doped ground plane strip overhung by pMOS transistors. The P doped ground planes are connected to Vdd, while the N doped ground planes are connected to ground, thus simplifying the power supply connection system.

The circuit 9 can thus present logic gates having different electrical characteristics without in any way making its manufacturing process complex. In particular, it is not necessary to use different types of metals to make the gates of the transistors of the circuit 9.

For all the integrated circuits described in the present application, it is possible to make gates known as midgap gates (whose work function is situated at the midpoint of the work function of silicon) for both the nMOS and the pMOS transistors. The work function of midgap gates is generally about 4.65 eV.

It is also possible to modulate the threshold voltages of the transistors of these integrated circuits by using gates having a P type work function, for example of 4.85 eV. It is also possible to modulate the threshold voltages of the transistors by using gates having an N type work function, for example of 4.45 eV. Such work function values for the gates will make it possible especially to obtain increased threshold voltages (here below known as SVth) and lowered threshold voltages (here below called SVtl).

It is also possible to include transistors without ground planes in the integrated circuit.

The following table summarizes different variants of transistors based on the variation of the work functions.

| Ref | Type | Work function | Doping of the ground plane | Type of well | Bias of the ground plane | Threshold voltage |
|---|---|---|---|---|---|---|
| 201 | NMOS | Type N | N | N | |Vdd| | SVtl |
| 202 | PMOS | Type P | P | P | 0 | SVtl |
| 203 | NMOS | Type N | N | P | 0 | Vtl |
| 204 | NMOS | Midgap | N | N | |Vdd| | Vtl |
| 205 | PMOS | Type P | P | N | |Vdd| | Vtl |
| 206 | PMOS | Midgap | P | P | 0 | Vtl |
| 207 | NMOS | Type N | P | P | 0 | Vt |
| 208 | NMOS | Type P | N | N | |Vdd| | Vt |
| 209 | NMOS | Midgap | N | P | 0 | Vt |
| 210 | NMOS | Midgap | P | N | |Vdd| | Vt |
| 211 | NMOS | Midgap | Without | | 0 | Vt |
| 212 | NMOS | Midgap | Without | | |Vdd| | Vt |
| 213 | PMOS | Type P | N | N | |Vdd| | Vt |
| 214 | PMOS | Type N | P | P | 0 | Vt |
| 215 | PMOS | Midgap | P | N | |Vdd| | Vt |
| 216 | PMOS | Midgap | N | P | 0 | Vt |
| 217 | PMOS | Midgap | Without | | 0 | Vt |
| 218 | PMOS | Midgap | Without | | |Vdd| | Vt |
| 219 | NMOS | Type P | N | P | 0 | Vth |
| 220 | NMOS | Midgap | P | P | 0 | Vth |
| 221 | PMOS | Type N | P | N | |Vdd| | Vth |
| 222 | PMOS | Midgap | N | N | |Vdd| | Vth |
| 223 | NMOS | Type P | P | P | 0 | SVth |
| 224 | PMOS | Type N | N | N | |Vdd| | SVth |

Figure 36:
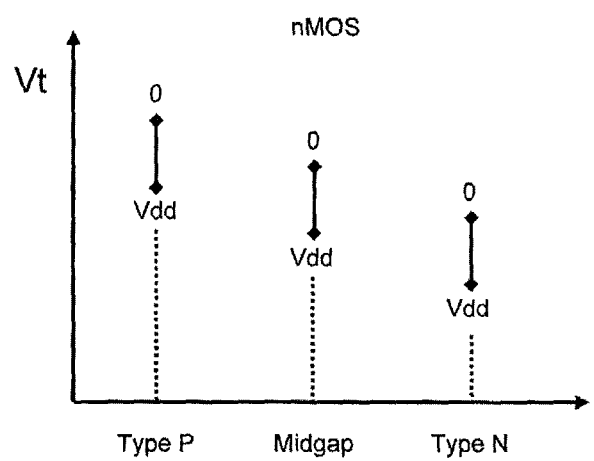
FIG. 36 is a graph showing the influence of the work function of the gate on the threshold voltage of an nMOS transistor.

For an nMOS transistor:
the use of a gate having a P type work function increases the minimum value and the maximum value of the voltage threshold range according to the bias relatively to a same midgap type gate transistor;
the use of a gate having an N type work function reduces the minimum value and the maximum value of the voltage threshold range as a function of the bias of the ground plane, as compared with a same midgap type gate transistor. The graph of FIG. 36 provides a schematic illustration of the respective ranges of threshold voltage as a function of the bias of the ground plane for midgap type nMOS transistors of P type and of N type.

For a pMOS transistor:
the use of a gate having a N type work function increases the minimum value and the maximum value of the voltage threshold range as a function of the bias as compared with a same midgap type gate transistor;
the use of a gate having an P type work function reduces the minimum value and the maximum value of the voltage threshold range as a function of the bias of the ground plane, as compared with a same midgap type gate transistor.

Such transistors are advantageously combined to form circuits integrating logic gates with very high density. The formation of logic gates involves the association of adjacent nMOS and pMOS transistors. When it is desired to place adjacent logic gates provided with distinct threshold voltage transistors, the nMOS and the pMOS transistors are laid out in alternating rows. To place an nMOS/pMOS pair with a threshold voltage of Vth adjacent to an nMOS/pMOS pair with a threshold voltage of Vtl using the rules described in detail in FIG. 4 and midgap type gates, it is necessary to make n and p wells in a checkerboard pattern to apply an appropriate bias to each ground plane. This pattern requires the formation of insulating trenches which appreciably reduces the integration density of the logic gates.

Figure 30:
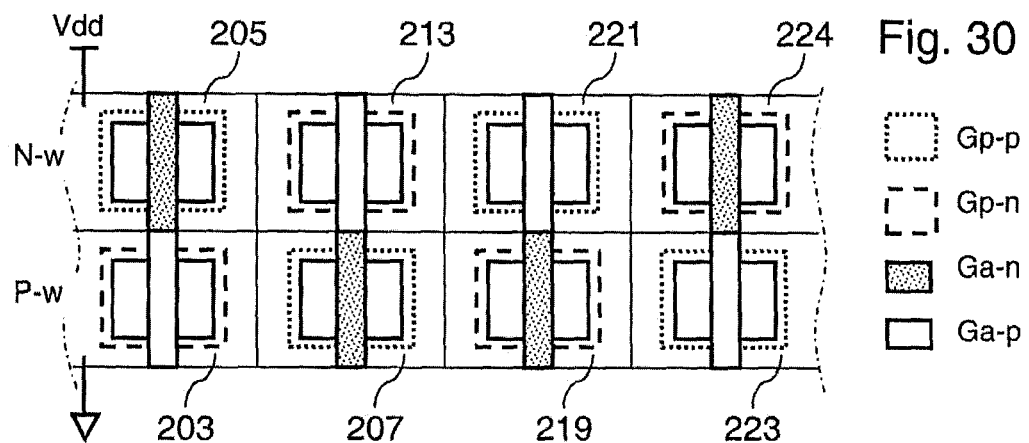
FIGS. 30 to 32 illustrate an example of an integrated circuit comprising transistors at different threshold voltages, in playing on the work function of their gate.
Figure 31:
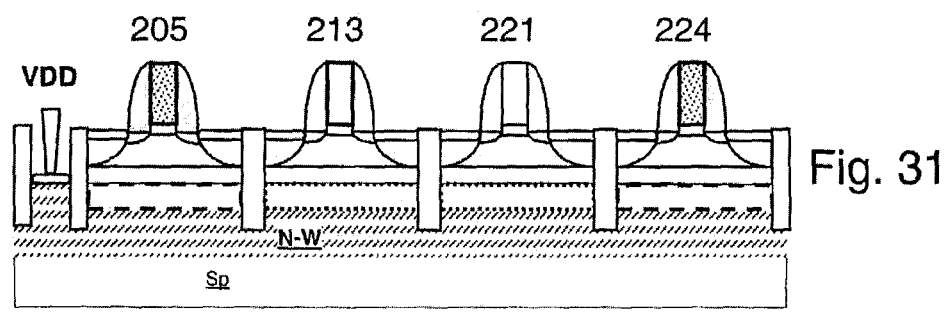
Figure 32:
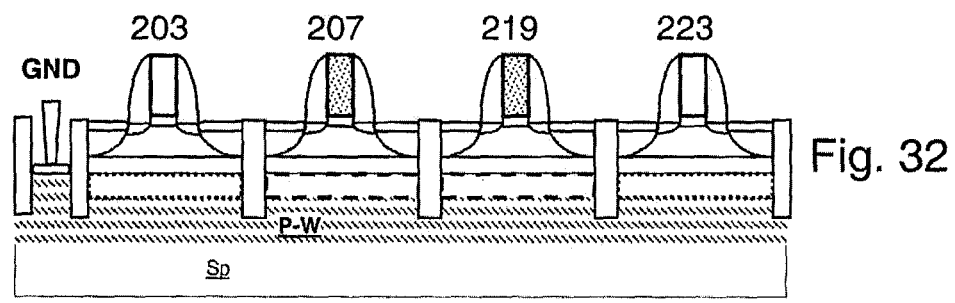

FIG. 30 is a schematic illustration of an example of an integrated circuit comprising transistors with different threshold voltages. In this structure, the nMOS transistors are laid out in a row and the pMOS transistors are laid out in an adjacent row. The references of the transistors in FIG. 30 correspond to the references of the above table. The nMOS transistors correspond to the references 203 (Vtl), 207 (Vt), 219 (Vth) and 223 (SVth) illustrated in a sectional view in FIG. 32. The pMOS transistors correspond to the references 205 (Vtl), 213 (Vt), 221 (Vth) and 224 (SVth) illustrated in a sectional view in FIG. 31. Such a structure makes it possible to make a same p well (P-w) in the form of a strip beneath an nMOS row and apply a common bias to it, for example to ground. Such a structure can also be used to make a same n well (N-w) in strip form beneath a row of pMOS transistors and apply a common bias to it, for example at Vdd. The integration density of the transistors can be optimized by restricting the use of the insulation trenches. Gp-p designates a ground plane with P type doping. Gp-n designates a ground plane with N type doping. Ga-n designates a gate with N type work function. Ga-p designates a gate with P type work function.

Figure 33:
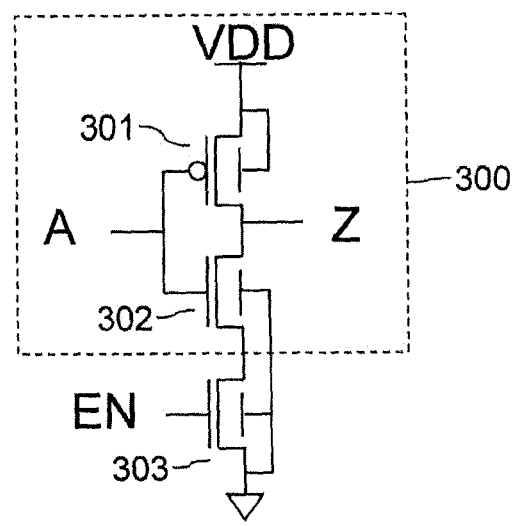
FIGS. 33 and 34 illustrate an example of an integrated circuit including transistors with distinct threshold voltages.

FIG. 33 illustrates an integrated circuit including transistors of different types. The circuit includes a logic module 300 connected between a voltage Vdd and a ground voltage. The logic module 300 includes especially transistors 301 and 302 with reduced threshold voltage in order to have available an optimum switching speed during its operation. The transistors 301 and 302 are connected to form an inverter. The transistor 301 is a pMOS transistor, the transistor 302 being an nMOS-type transistor. The logic module is connected by means of at least one transistor 303 with raised threshold voltage to a ground line. The control signal EN on the gate of the transistor 303 makes it possible to turn it selectively on or off. The transistor 303 has a raised threshold voltage used to very sharply restrict the leakage current when the logic module is not operational, in order to minimize its electric consumption, when the transistor 303 is off. The transistors 301 and 302 with lowered threshold voltage provide the benefit of limited access time when the logic module 300 is in operation, and when the transistor 303 is on.

A transistor with raised threshold voltage can also connect the logic module 300 to a voltage Vdd in order to reduce the leakage current. The logic module 300 can also be connected to the voltages Vdd and ground by respective transistors with raised threshold voltage.

Figure 34:
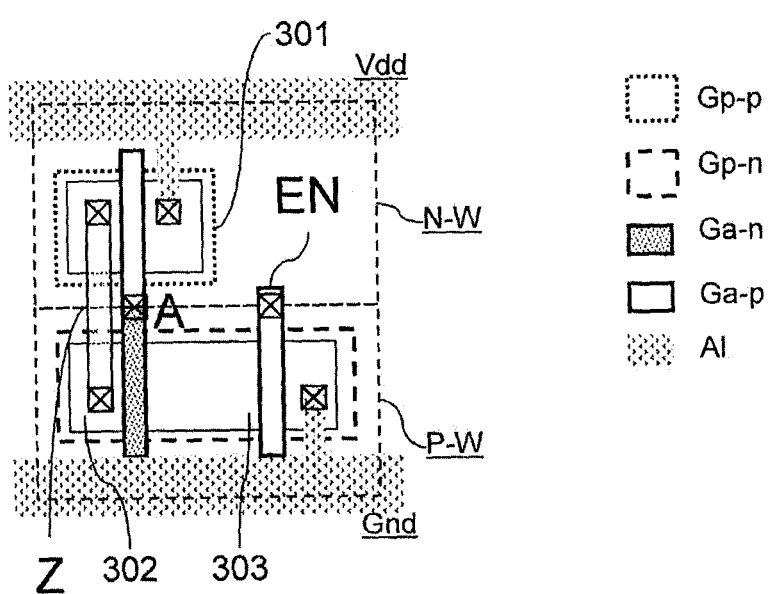

FIG. 34 is a schematic view of an example of integration topology of the transistors 301 and 303. The lines identified by Al correspond to power supply lines connected respectively to Vdd and the ground voltage. As illustrated, the transistors 302 and 303 are made on a well with P type doping and have a ground plane with N type doping. The ground plane of the transistors 302 and 303 is biased at a ground voltage. The transistor 301 is made on a well with N type doping and has a ground plane with P type doping. The ground plane of the transistor 301 is biased at Vdd. The transistors 301 and 303 have gates with P type work functions. The transistor 302 has a gate with N type work function.

Figure 35:
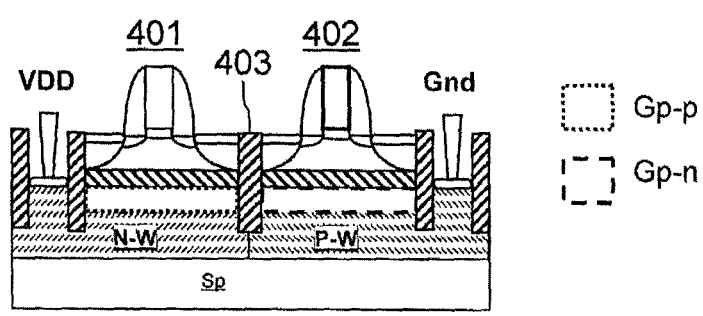
FIG. 35 is a view in cross-section of two adjacent transistors at standard threshold voltage according to one alternative.

FIG. 35 is a view in section of two adjacent transistors having a standard threshold voltage Vt. The transistor 401 is an nMOS transistor, the transistor 402 being a pMOS transistor. The nMOS transistor 401 has a ground plane with P type doping, biased by a voltage Vdd. The pMOS transistor 402 has a ground plane with N type doping, biased by a ground voltage.

If these transistors were to be made using gates with the same work function values, in playing solely on the voltage of their ground plane and on the doping of their ground plane, the biased values applied to the respective ground plane of the transistors would generate, beneath the insulator layer because these transistors are adjacent, a forward-biased PN junction short-circuiting the power supply with the ground.

To prevent this problem, the transistors 401 and 402 are made respectively on N type doping wells and P type doping wells. The transistors 401 and 402 are also separated by an insulation trench 403 extending on the active layer up to the junction between the N-W and P-W wells.

Although only a few types of logic gates have been illustrated, the invention applies of course to any other type of logic gate.

Although the invention has been described hitherto for digital applications, it is also possible to apply the invention to analog circuits comprising transistors used in linear mode.

In the examples of transistors described in detail here above, the difference in potential between the ground plane and the source is included between a zero value and a value Vdd for an nMOS transistor and between a zero value and a value −Vdd for a pMOS transistor. It is possible however to envisage applying a value of potential difference greater than Vdd for an nMOS transistor or smaller than −Vdd for a pMOS transistor: the value of the threshold voltage is then further reduced. It is also possible to envisage applying a value of potential difference below 0 for an nMOS transistor or greater than 0 for a pMOS transistor: the value of the threshold voltage is then further increased.

The invention claimed is:

1. An integrated circuit having an active semi-conductive layer, separated from a semi-conductive substrate layer by a buried layer of insulator material, including PMOS and NMOS transistors, said integrated circuit comprising: first and second transistors that are both PMOS or both NMOS; and first and second ground planes respectively positioned plumb with the first and second transistors between the buried layer of insulator material and the silicon substrate layer, wherein the first transistor has a type of doping of its ground plane opposite to that of its source, and has a first threshold voltage; wherein the second transistor has a type of doping of its ground plane identical to that of its source, and has a second threshold voltage; wherein the first threshold voltage is a function of a difference in potential applied between the source and the ground plane of the first transistor; wherein the second threshold voltage is a function of a difference in potential applied between the source and the ground plane of the second transistor; wherein the first and second threshold voltages are capable of varying respectively in first and second ranges of voltages should the difference in potential between the ground plane and the source of the first or second transistor vary between a zero value and a value equal to a power supply voltage of the circuit; and wherein the thickness of the buried layer of insulator material is fine enough for the maximum value of the first range to be at least 10% greater than the minimum value of the first range, and the minimum value of the second range to be at least 10% less than the maximum value of the second range.

2. The integrated circuit of claim 1, wherein the maximum value of the first range is greater than the maximum value of the second range.

3. The integrated circuit of claim 2, wherein the maximum value of the first range is at least 40 mV greater than the minimum value of the first range, and wherein the minimum value of the second range at least 40 mV less than the maximum value of the second range.

4. The integrated circuit of claim 1, wherein the thickness of the buried layer of insulator material in the first and second transistors is fine enough for the first threshold voltage to be greater than the second threshold voltage when differences in reference potential applied between the source and the ground plane of the first and second transistors are the same.

5. The integrated circuit of claim 1, wherein the first and second transistors have respective gates made out of the same type of metal.

6. The integrated circuit of claim 5, wherein, except for the doping of their respective ground planes, the first and second transistors have an identical structure.

7. The integrated circuit of claim 1, wherein the first and second transistors have gates made out of metals having distinct work function values.

8. The integrated circuit of claim 1, further comprising a memory having: at least one word line; at least two bit lines; and a 4T-type memory cell including third and fourth transistors and fifth and sixth transistors, wherein the fifth transistor has a structure similar to that of the third transistor to show a same threshold voltage, wherein the sixth transistor has a structure similar to that of the fourth transistor to show a same threshold voltage, wherein the third and fourth transistors are of opposite types, wherein the third and fifth transistors are connected to form a bistable flip-flop circuit having two storage nodes, and wherein the fourth and sixth transistors are controlled by the word line to selectively connect the nodes of the bistable flip-flop circuit to respective bit lines.

9. The integrated circuit of claim 8, wherein the differences in potential between the sources of the third and fifth transistors and their respective ground planes are substantially zero, and wherein the differences in potential between the sources of the fourth andسسixth transistors and their respective ground plane are substantially equal to a voltage $V_{dd}$.

10. The integrated circuit of claim 8, further comprising a seventh transistor made in the semi-conductive active layer, the seventh transistor being devoid of any ground plane between the buried layer of insulator material and the substrate layer placed over it.

11. The integrated circuit of claim 10, further comprising an nMOS-type eighth transistor and a pMOS-type ninth transistor, eighth and ninth ground planes respectively placed plumb with the eighth and ninth transistors between the buried layer of insulator material and the substrate layer, the eighth ground plane having P type doping and the ninth ground plane having N type doping; a well with N type doping separating the eighth ground plane from the substrate layer; a well with P type doping separating the ninth ground plane from the substrate layer; and an insulating trench extending from the active silicon layer to said wells so as to separate the eighth and ninth ground planes.

12. The integrated circuit of claim 11, wherein the well with N type doping is excited by a voltage $V_{dd}$ and the well with P type doping is connected to a ground.

13. The integrated circuit of claim 11, wherein the first and second transistors are adjacent, wherein the ground planes of the first and second transistors are separated from the semi-conductive substrate layer by a first well forming a strip and having a first type of doping, the first well being powered by a first level of voltage, the integrated circuit further comprising tenth and eleventh transistors of a type opposite the first and second transistors, the tenth and eleventh transistors being adjacent and having ground planes for which the types of doping are opposite, the ground planes of the tenth and eleventh transistors being separated from the semi-conductive substrate layer by a second well adjacent to the first well and forming a strip, the second well having a doping of a second type opposite to that of the first type, the second well being powered by a second voltage level, the first and tenth transistors having respective gates whose work function values are distinct, and the second and eleventh transistors having respective gates whose work function values are distinct.

14. The integrated circuit of claim 13, wherein the first and tenth transistors are adjacent and belong to the same logic gate, wherein the second and eleventh transistors are adjacent and belong to the same logic gate, wherein the type of doping of the ground plane of the first transistor is opposite the type of doping of the ground plane of the tenth transistor, and wherein the first and second transistors have respective gates for which the work function values are distinct.

15. The integrated circuit of claim 1, further comprising a memory including: at least one word line; at least two bit lines; and a 4T-type memory cell including third and fourth transistors and also including fifth and sixth transistors, wherein the third to sixth transistors are positioned so as to be placed plumb with respective ground planes between the buried layer of insulator material and the substrate layer, wherein the fifth transistor is of the same type as the third transistor, wherein the sixth transistor is of the same type as the fourth transistor, wherein the third and fourth transistors are of opposite types, wherein the third and fifth transistors are connected to form a bistable flip-flop circuit with two storage nodes, wherein ground planes of the third and fourth transistors are connected to a gate of the third transistor, wherein ground planes of the fifth and sixth transistors are connected to a gate of the fifth transistor, and wherein the fourth (MAL) and sixth (MAR) transistors are controlled by the word line to respectively connect the nodes of the bistable flip-flop circuit to respective bit lines.

16. The integrated circuit of claim 1, further comprising a memory including first and second 6T-type memory cells, each having one word line, two bit lines, two load transistors and two driver transistors connected to form a bistable flip-flop circuit having two storage nodes, each memory cell having two access transistors controlled by the word line to selectively connect the nodes of the bistable flip-flop circuit to the respective bit lines, wherein the first transistor forms an access transistor of the first memory cell, and wherein the second transistor forms an access transistor of the second memory cell.

17. The integrated circuit of claim 16, wherein driver transistors of the first memory cells have a type of doping of their ground plane that is identical to that of the ground plane of their access transistor, a thickness of the layer of insulator material identical to that of their access transistor, and a biasing of their ground plane identical to that of the ground plane of their access transistor.

18. The integrated circuit of claim 17, wherein a ground plane is common for a driver transistor and for an access transistor of one of the memory cells.

19. The integrated circuit of claim 1, further comprising: first and second logic gates, each logic gate including at least two transistors controlled by respective input terminals, wherein said first transistor forms one of said transistors of the first logic gate, and wherein said second transistor forms one of said transistors of the second logic gate.

20. The integrated circuit of claim 19, wherein said first and second transistors are nMOS-type transistors.

21. The integrated circuit of claim 20, wherein the difference in potential between the ground plane and the source of the first transistor is zero, and wherein the difference in potential between the ground plane and the source of the second transistor is equal to a voltage $V_{dd}$.

22. The integrated circuit of claim 1, wherein the buried layer of insulator material has a thickness below 50 nm, and wherein the widths of the gates of said transistors are less than 50 nm.

23. The integrated circuit of claim 1, wherein the buried layer of insulator material has a thickness smaller than a gate length of one of said transistors.

24. The integrated circuit of claim 1, further comprising a logic module including the second transistor, the first transistor connecting the logic module to a power supply voltage, a zero difference in potential being applied between the source and the ground plane of the first transistor, and a difference in potential with a value zero being applied between the source and the ground plane of the second transistor.

* * * * *